(12) United States Patent
Zuppero et al.

(10) Patent No.: US 6,944,202 B2
(45) Date of Patent: Sep. 13, 2005

(54) SURFACE CATALYST INFRA RED LASER

(75) Inventors: Anthony C. Zuppero, Pollock Pines, CA (US); Jawahar M. Gidwani, San Francisco, CA (US)

(73) Assignee: Neokismet, L.L.C., San Francisco, CA (US)

( * ) Notice: Subject to any disclaimer, the term of this patent is extended or adjusted under 35 U.S.C. 154(b) by 0 days.

(21) Appl. No.: 10/218,706

(22) Filed: Aug. 14, 2002

(65) Prior Publication Data

US 2002/0196825 A1 Dec. 26, 2002

Related U.S. Application Data

(62) Division of application No. 09/691,948, filed on Oct. 19, 2000, which is a continuation-in-part of application No. 09/589,669, filed on Jun. 7, 2000, now Pat. No. 6,327,859, which is a division of application No. 09/304,979, filed on May 4, 1999, now Pat. No. 6,114,620.
(60) Provisional application No. 60/160,527, filed on Oct. 20, 1999.

(51) Int. Cl.$^7$ ............................................... H01S 3/095
(52) U.S. Cl. ............................ 372/89; 372/69; 372/90; 372/55
(58) Field of Search ............................. 372/59, 90, 89, 372/51, 52, 53, 55, 69; 357/342

(56) References Cited

U.S. PATENT DOCUMENTS

| 3,694,770 A | 9/1972 | Burwell et al. |
|---|---|---|
| 4,012,301 A | 3/1977 | Rich et al. |
| 4,045,359 A | 8/1977 | Fletcher et al. |
| 4,407,705 A | 10/1983 | Garscadden et al. |
| 4,590,507 A | 5/1986 | Capasso et al. |
| 4,634,641 A | 1/1987 | Nozik |
| 4,651,324 A | 3/1987 | Prein et al. |

(Continued)

FOREIGN PATENT DOCUMENTS

| DE | 1230509 | 12/1966 |
|---|---|---|
| JP | 02157012 A | 6/1990 |
| NL | 1065463 | 4/1967 |
| WO | WO 00/72384 A1 | 11/2000 |
| WO | WO 01/28677 A1 | 4/2001 |
| WO | WO 01/28677 A1 | 4/2001 |
| WO | WO 01/29938 A1 | 4/2001 |

OTHER PUBLICATIONS

"Electron–hole pair creation by reactions at metal surfaces", downloaded from www.aps.org/meet/CENT99/BAPS/abs?S6980001.html American Physical Society Centennial Meeting Program, Atlanta, Ga. Mar. 20–26, 1999.
"Electron–Hole Pair Creation at Ag and Cu Surfaces by Adsorption of Atomic Hydrogen and Deuterium", Physical Review Letters, vol. 82, No. 2. Jan. 11, 1999.

(Continued)

Primary Examiner—Tom Thomas
Assistant Examiner—Matthew Landau
(74) Attorney, Agent, or Firm—Baker & McKenzie LLP

(57) ABSTRACT

An energy converter reacts hydrocarbons and air on a catalyst configuration to produce a population inversion. A photovoltaic system may extract the radiating energy, and a laser system may extract a significant fraction of the reaction energy in the form of coherent radiation. The flooding of the catalyst adsorption sites with fuel and the choice of catalyst predisposes the adsorbing oxygen molecules to create monoatomic oxygen hot-atoms, which deposit the considerable energy of oxygen adsorption directly into a reaction channel of adjacent, adsorbed and simple fuel radicals, thereby producing simple, energetic product molecules, concentrating the energy in one or a few modes, and strongly favoring inverted populations. A solid state method to stimulate precursor chemisorbed specie dissociation accelerates the reaction rates, providing a method to greatly intensify pulsed power output, increase efficiency, and to facilitate nanoscale and micro-scale thermal energy heat rejection processes.

40 Claims, 2 Drawing Sheets

U.S. PATENT DOCUMENTS

| | | |
|---|---|---|
| 4,686,550 A | 8/1987 | Capasso et al. |
| 4,753,579 A | 6/1988 | Murphy |
| 4,756,000 A | 7/1988 | Macken |
| 4,849,799 A | 7/1989 | Capasso et al. |
| 5,048,042 A | 9/1991 | Moser et al. |
| 5,057,162 A | 10/1991 | Nelson |
| 5,293,857 A | 3/1994 | Meyer |
| 5,299,422 A | 4/1994 | Nakagawa et al. |
| 5,311,009 A | 5/1994 | Capasso et al. |
| 5,317,876 A | 6/1994 | Nakagawa et al. |
| 5,337,329 A | 8/1994 | Foster |
| 5,408,967 A | 4/1995 | Foster |
| 5,470,395 A | 11/1995 | Yater et al. |
| 5,488,231 A | 1/1996 | Kwon et al. |
| 5,525,041 A | 6/1996 | Deak |
| 5,587,827 A | 12/1996 | Hakimi et al. |
| 5,593,509 A | 1/1997 | Zuppero et al. |
| 5,632,870 A | 5/1997 | Kucherov |
| 5,641,585 A | 6/1997 | Lessing et al. |
| 5,651,838 A | 7/1997 | Fraas et al. |
| 5,674,698 A | 10/1997 | Zarling et al. |
| 5,698,397 A | 12/1997 | Zarling et al. |
| 5,736,410 A | 4/1998 | Zarling et al. |
| 5,757,833 A | 5/1998 | Arakawa et al. |
| 5,763,189 A | 6/1998 | Buechler et al. |
| 5,891,656 A | 4/1999 | Zarling et al. |
| 5,917,195 A | 6/1999 | Brown |
| 5,932,885 A | 8/1999 | DeBellis et al. |
| 5,999,547 A | 12/1999 | Schneider et al. |
| 6,067,309 A | 5/2000 | Onomura et al. |
| 6,084,173 A | 7/2000 | DiMatteo |
| 6,114,620 A | 9/2000 | Zuppero et al. |
| 6,119,651 A | 9/2000 | Anderson |
| 6,159,686 A | 12/2000 | Kardos et al. |
| 6,172,427 B1 | 1/2001 | Shinohara et al. |
| 6,218,608 B1 | 4/2001 | Zuppero et al. |
| 6,222,116 B1 | 4/2001 | Zuppero et al. |
| 6,232,546 B1 | 5/2001 | DiMatteo et al. |
| 6,238,931 B1 | 5/2001 | Buechler et al. |
| 6,251,687 B1 | 6/2001 | Buechler et al. |
| 6,268,560 B1 | 7/2001 | Zuppero et al. |
| 6,312,914 B1 | 11/2001 | Kardos et al. |
| 6,327,859 B1 | 12/2001 | Zuppero et al. |
| 6,396,191 B1 | 5/2002 | Hagelstein et al. |
| 6,399,397 B1 | 6/2002 | Zarling et al. |
| 6,444,476 B1 | 9/2002 | Morgan |
| 6,537,829 B1 | 3/2003 | Zarling et al. |
| 6,649,823 B2 | 11/2003 | Zuppero et al. |
| 6,678,305 B1 | 1/2004 | Zuppero et al. |
| 6,700,056 B2 | 3/2004 | Zuppero et al. |
| 2001/0018923 A1 | 9/2001 | Zuppero et al. |
| 2002/0017827 A1 | 2/2002 | Zuppero et al. |
| 2002/0045190 A1 | 4/2002 | Wilson et al. |
| 2002/0070632 A1 | 6/2002 | Zuppero et al. |
| 2002/0121088 A1 | 9/2002 | Zuppero et al. |
| 2002/0196825 A1 | 12/2002 | Zuppero et al. |
| 2003/0000570 A1 | 1/2003 | Zuppero et al. |
| 2003/0019517 A1 | 1/2003 | McFarland |
| 2003/0030067 A1 | 2/2003 | Chen |
| 2003/0100119 A1 | 5/2003 | Weinberg et al. |
| 2003/0166307 A1 | 9/2003 | Zuppero et al. |
| 2003/0207331 A1 | 11/2003 | Wilson et al. |

OTHER PUBLICATIONS

Harrison, P. et al., The Carrier Dynamics of Far–Infrared Intersubband Lasers and Tunable Emitters, Institute of Microwaves and Photonics, University of Leeds, U.K., pp. 1–64.

Weber, et al., to X2 Electron Transfer Times in Type–II GaAs/A1As Superflattices Due to Emission of Confined and Interface Phonons, Superlattices and Microstructures, vol. 23, No. 2 (1998).

Fann, W.S. et al., Electron Thermalization in Gold, Physical Review B, Brief Reports, vol. 46, No. 20, (1992).

Ultrafast Surface Dynamics Group, Time–Resolved Two–Photon Photoemission (TR–2PPE), http://www.lip.physik.uni–essen.de/aeschilmann/2y_photo.htm.

Lewis et al., Vibrational Dynamics of Molecular Overlayers on Metal Surfaces, Dept. of Chemistry, University of Pennsylvania, http://lorax.chem.upenn.edu/ molsurf/cucotalk/html.

Rettner et al., Dynamics of the Chelmisorption of 02 on Pt(111): Dissociation via Direct Population of a Molecularty Chemisorbed Precursor at High Incidence Kinetic Energy, The Journal of Chemical Physics, vol. 94, Issue 2 (1991).

Friedman et al., SiGa/Si THz Laser Based on Transitions Between Inverted Mass Light–Hole and Heavy Hole Standards, Applied Physics Letters, vol. 78, No. 4 (2001).

Harrison et al., Popultion –Inversion and Gain Estimates for a Semiconductor TASER.

Harrison et al., Theoretical Studies of Subband Carrier Lifetimes n an Optically Pumped Three–Level–Terahertz Laser, Superlattices and Microstructures, vol. 23, No. 2 (1998).

Harrison et al., Room Temperature Population Inversion in SiGe TASER Designs, IMP, School of Electronic and Electrical Engineering, The University of Leeds.

Sun et al., Pheonon–Pumped Terhertz Gain in n–Type GaAs/AlGaAs Superlattices, Applied Physic Letters, vol. 7; No. 22 (2001).

Altukhov et al., Towards Si1–xGex Quantum–Well Resonant–State Terahertz Laser, Applied Physics Letters, vol. 79, No. 24 (2001).

Sun et al., Intersubband Lasing Lifetimes of SiGe/Si and GaAs/AlGaAs Multiple Quantum Well Structures, Applied Physics Letters, vol. 66, No. 25 (1995).

Sun et al., Phonon Pumped SiGe/Si Interminiband Terahertz Laser.

Soref et al., Terhertz Gain in a SiGe/Si Quantum Starcase Utilizing the Heavy–Hole Inverted Effective Mass, Applied Physics Letters, vol. 79, No. 22 (2001).

Aeshlimann et al., Competing Nonradative Channels for Hot Electroni Induced Surface Photochemistry, Chemical Physics 202, 127–141 (1996).

Auerbach, Daniel J., Hitting the Surface–Softly, Science, Vo. 294, pp. 2488–2489 (2001).

Badescu et al., Energetics and Vibrational States for Hydrogen on Pt(111), Physical Review Letters, vol. 88, No. 13 (2002).

Balandin et al., Effect of Phonon Confinement on the Thermoelectric Figure of Merit of Quantum Wells, Journal of Applied Physics, vol. 84, No. 11 (1998).

Bartels et al., Coherent Zone–Folded Longitudinal Acoustic Phonons in Semiconductor Superlattices: Excitation and Detection, Physical Review Letters, vol. 82, No. 5 (1999).

Baumberg et al., Ultrafast Acoustic Phonon Ballistics in Semiconductor Heterostructures, Physical Review Letters, vol. 78, No. 17 (1997).

Bedurftig et al., Vibrational and Structural Properties of OH Adsorbed on Pt(111), Journal of Chemical Physics, vol. 111, No. 24 (1999).

Valden et al., Onset of Catalytic Activity of Gold Clusters on Titania with the Appearance of Nonmetallic Properties, Science, vol. 281 (1998).

Bondzie et al., Oxygen Adsorption on Well–Defined Gold Particles on TiO2(110), J. Vac. Sci. Technol. A17(4) (1999).

Bezant et al., Intersubband Relaxation Lefetimes in p–GaAs/AlGaAs Quantum Wells Below theLO–Ohonon Energy Measured in a Free Electron Laser Experiment, Semicond, Sci. Technol. 14(1999).

Brako et al., Interaction of CO Molecules Adsorbed on Metal Surfaces, Vacuum 61,89–93 (2001).

Burgi et al., Confinement of Surface State Electronis in Fabry–Perot Resonators, Physical Review Letters, vol. 81, No. 24 (1998).

Burgi et al., Probing Hot–Electron Dynamics at Surfaces with a Cold Scanning Tunneling Microscope, Physical Review Letters, vol. 82, No. 22 (1999).

Chang, Y.M., Interaction of Electron and Hold Plasma with Coherent Longitudinal Optical Phonons in GaAs, Applied Physics Letter, vol. 80, No. 14 (2002).

Chang et al., Observation of Coherent Surface Optical Phonon Oscillations by Time–Resolved Surface SecondHarmonic Generation, Physical Review Letters, vol. 76, No. 24 (1997).

Chang et al., Coherent Phonon Spectroscopy of GaAs Surfaces Using Time–Resolved Second–Harmonic Generation, Chemical Physics 251, 283–308 (2000).

Chang et al. Observation of Local–Interfacial Optical Phonons at Buried Interfaces Using Time–Resolved Second Harmonic Generation, Physical Review B, vol. 59, No. 19 (1999).

Chen et al., Stimulate–Emission–Induced Enhancement of the Decay Rate of Longitudinal Optical Phonons in III–V Semiconductors: Applied Physics Letters, vol. 80, No. 16 (2002).

Corcelli et al., Vibrational Energy Pooling in CO on NaCl(100): Methods, Journal of Chemical Physics, vol. 116, No. 18 (2002).

Fierz et al., Time–Resolved 2–Photon Photolonization on Metallic Nanoparticles, Appl. Phys. B 68 (1999) http://www.lip.physlk.uni–essen.de/aeschilmann/abstractct.htm#6.

Bezant et al., Intersubband Relaxation Lifetimes in p–GaAs/AlGaAs Quantum Wells Below the LO–Phonon Energy Measured in a Free Electron Laser Experiment, Semicond. Sci. Technol., 14 No. 8 (1999).

Bondzie et al., Oxygen Adsorption on Well–Defined Gold Particles on TlO2(110), Journal of Vacuum Science & Technology A: Vacuum, Surfaces and Films, vol. 17, Issue 4, pp. 1717–1720 (1999).

Harrison et al., Maximising the Population Inversion, by Optimizing the Depopulation Rate, in Far–Infrared Quantum Cascade Lasers (2001).

Harrison et al., The Carrier Dynamics of Terahertz Intersubband Lasers, Some Publishing Company (1999).

Fann et al., Electron Thermalization in Gold, Physical Review B, vol. 46, No. 20 (1992).

Cummings et al., Ultrafast Impuslive Excitation of Coherent Longitudinal Acoustic Phonon Oscillations in Highly Potoexcited inSb, Applied Physics Letters, vol. 79, No. 6 (2001).

Chiang, T.C., Photoemission Studies of Quantum Well States in Thin Films, Surface Science Reports 39, pp. 181–235 (2000).

Debernardi et al., Anharmonic Phonon Lifetimes in Semiconductors from Density–Functional Perturbation Theory, Physical Review Letters, vol. 75, No. 9 (1995).

Davis et al., Kinetics and Dynamics of the Dissociative Chemisorption of Oxygen on Ir(111), J. Chem. Phys. 109 (3) (1997).

Choi et al., Ultrafast Carrier Dynamics in a Highly Excited GaN Epilayer, Physical Review B., Vo. 63, 115315 (2001).

Diekhoner et al., Parallel Pathways in Methanol Decomposition on PT(111), Surface Science 409, pp. 384–391 (1996).

Demidenko et al., Plezoelectrically Active Acoustic Waves Confined in a Quantum Well and Their Amplification by electron Drift, Semiconductor Physics, Quantum Electronics & Optoelectronis, vol. 3, No. 4, pp. 427–431 (2000).

de Paula et al., to X2 Electron Transfer Times in Type–II Superlattices Due to Emission of Confined Phonons, Appl. Phys. Lett. 55 (10) (1994).

de Paula et al., Carrier Capture via Confined Phonons in GaAs–AlGaAs Multiple Quantum Wells, Seicond. Sci. Technol. 9, pp. 730–732 (1994).

Demidenko et al., Amplification of Localized Acoustic Waves by the Electron Drift in a Quantum Well, Semiconductor Physics, Quantum Electronics & Optoelectronics, vol. 2, No. 1, pp. 11–24 (1999).

Demidenko et al., Generation of Coherent Confined Acoustic Phonons by Drifting Electrons in Quantum Wire; Semiconductor Physics, Quantum Electronics & Optoelectronics, vol. 3, No. 4, pp. 432–437 (2000).

Denzler et al., Surface Femtochemistry: Ultrafast Reaction Dynamics Driven by Hot Electron Mediated Reaction Pathways, World Scientific (2001).

Fatti et al., Temperature–Dependent Electron–lattice Thermalization in GaAs, Physical Review B, vol. 59, No. 7 (1999).

Anastassakis et al., The Physics of Semiconductors, vol. 2, World Scientific (1990).

de Paula et al., Carrier Capture Processes in Semiconductor Superlattices due to Emission of confined Phonons, J. Appl. Phys. 77 (12) (1996).

"The Solarex Guide to Solar Electricity" Solarex Corporation, Inc. Frederich, MD, pp. 66–67, Apr. 1979.

Engstrom et al., Comparing the Vibrational Properties of Low–Energy Modes of a Molecular and an Atomic Adsorbate: CO and O on Pt(111), Journal of Chemical Physics, vol. 112, No. 4 (2000).

Glavin et al., Generation of High–Frequency Coherent Acoustic Phonons in a Weakly Coupled Superlattice, Applied Physics Letters, vol. 74, No. 23 (1999).

Friedman, SiGe/Si Thz Laser Based on Transitions Between Inverted Mass Light–Hole and Heavy–Hole Subbands, Applied Physics Letters, vol. 78, No. 4 (2001).

Ermoshin et al., Vibrational Energy Relaxation of Adsorbate Vibrations: A theoretical Study of the H/Si(111) System, J. Chem. Phys. 105 (20) (1996.

Glavin et al., Acoustic Phonon Generation in A Superlattice Under the Hopping Perpendicular Transport, United Nations Educational Scientific and Cultural Organization and International Atomic Energy Agency (1998).

Gergen et al., Chemically Induced Electronic Excitations at Metal Surfaces, Science, vol. 294 (2001).

Hagston et al., Simplified Treatment of Scattering Processes in Quantum Well Structures, Journal of Applied Physics, vol. 90, No. 3 (2001).

Harrison et al., Room Temperature Population Inversion in SiGe TASER designs.

Harrison et al. The Carrier Dynamics of Terhertz Intersubband Lasers, Some Publishing Company (1999).

Harrison et al., Population–Inversion and Gain Estimates for a Semiconductor Taser.

Harrison et al., Theoretical studies of Subband Carrier Lifetimes in an Optically Pumped Three–Level Terahertz Laser, Superlattices and Microstructures, vol. 23, No. 2 (1998).

Harrison et al., The Carrier Dynamics o Far–Infrared Intersubband Lasers and Tunable Emitters, www.ae.leads.ac.uk/homes/ph/.

Hess et al., Hot Carrier Relaxation by Extreme Electron–LO Phonon Scattering in GaN.

Hohlfeld et al., Electron and Lattice Dynamics Following Optical Excitation of Metals, Chemical Physics 251, pp. 237–258 (2000).

Huang et al., Vibrational Promotion of Electron Transfer, Science, vol. 290 (2000).

Kawakami et al., Quantum–well States in Copper Thin Films, Nature, vol. 398 (1999).

Kohler et al., Enhanced Electron–Photon Coupling at the Mo and W (110) Surfaces Induced by Adsorbed Hydrogen, mtri–th/9510004 (1995).

Lewis et al., Continuum Elastic Theory of Adsorbate Vibrational Relaxation, J. Chem. Phys. 108 (3) (1998).

Lewis et al., Controlling Adsorbate Bivrational Lifetimes Using Superlattices, Physical Review B, vol. 63, 085402 (2001).

Komirenko, Sergly M., Phonons and Phonon–Related Effects in Prospective Nanoscale Semiconductor Devices (2000).

Huang et al., Observation of Vibrational Excitation and Deexcitation for NO(v=2) Scattering from Au(111): Evidence for Electron–Hole–Pair Mediate Energy Transfer, Physical Review Letters, vol. 84, No. 13 (2000).

Lewis et al, Substrate–Adsorbate Coupling in Co–Adsorbed Copper, Physical Review Letters, vol. 77, No. 26 (1995).

Krauss et al., Coherent Acoustic Phonons in a Semiconductor Quantum Dot, Physical Review Letters, vol. 79, No. 25 (1997).

Lugli et al., Interaction of Electrons with Interface Phonons in GaAs/AlAs and GaAs/AlGaAs Heterostructures,Semicond. Sci. Technol. 7 (1992).

Nienhaus et al., Electron–Hole Pair Creation at Ag and Cu Surfaces by Adsorption of Atomic Hydrogen and Deuterium, Physical Review Letters, vol. 82, No. 2 (1999).

Mulet et al., Nanoscale Radiative Heat Transfer Between a Small Particle and a Plane Surface, Applied Physics Letters, vol. 78, No. 19 (2001).

Nienhaus et al., Direct Detection of Electron–Hole Pairs Generated by Chemical Reactions on Metal Surfaces, Surface Science 445, pp. 335–342 (2000).

Nienhaus, Hermann, Electron Excitations by Chemical Reactions on Metal Surfaces, Surface Science Reports 45, pp. 1–78 (2002).

Nolan et al., Translational Energy selection of Molecular Precursors to Oxygen Adsorption on Pt(111), Physical Review Letters, vol. 81, No. 15 (1998).

Nienhaus et al., Selective H Atom Sensors Using Ultrathin Ag/Si Schottky Diodes, Applied Physics Letters, vol. 74, No. 26 (1999).

Nolan et al., Molecularly Chemisorbed Intermediates to Oxygen Adsorption on Pt(111): A Molecular Beam and Electron Energy–Loss Spectroscopy Study, Journal of Chemical Physics, vol. 111, No. 8 (1999).

Nolan et al., Direct Verification of a High–Translational–Energy Molecular Precursor to Oxygen Dissociation on Pd(111), Surface Science 419 (1998).

Ogawa et al., Optical Intersubband Transitions and Femtosecond Dynamics in Ag/Fe(100) Quantum Wells, Physical Review Letters, vol. 88, No. 11 (2002).

Plihal et al., Role of Intra–Adsorbate Coulomb Correlations in Energy Transfer at Metal Surfaces, Physical Review B, vol. 58, No. 4 (1998).

Paggel et al., Quantum–Well States as Fabry–Perot Modes in a Thin–Film Electron Interferometer, Science, vol. 283 (1999).

Paggel et al., Quasiparticle Lifetime in Macroscopically Uniform Ag/Fe(100) Quantum Wells, Physical Review Letters, vol. 81, No. 25 (1998).

Paggel et al., Quantum Well Photoemission from Atomically Uniform Ag Films: Determination of Electronic Band Structure and Quasi–Particle Lifetime in Ag(100) Applied Surface Science 162–163, pp. 78–85 (2000).

Persson et al., A First–Principles Potential Energy Surface for Eley–Rideal Reaction Dynamics of H Atoms on Cu(111), Journal of Chemical Physics, vol. 110, No. 4 (1999).

Ozgur et al., Control of Coherent Acoustic Phonons in InGaN Multiple Quantum Wells, arXiv:cond–mat/0010170 (2000).

Stanton et al., Energy Relaxation by Hot Electrons in n–GaN Epilayers, Journal of Applied Physics, vol. 89, No. 2 (2001).

Stipe et al., Atomistic Studies of O2 Dissociation on Pt(111) Induced by Photons, Electrons and by Heating, J. Chem. Phys. 107 (16) (1997).

Sun et al., Phonon Pumped SiGe/Sl Interminiband Terahertz Laser, pp. 1–11.

Soref et al., Terahertz Gain in a SiGe/Sl Quantum Staircase Utillzing the Heavy–Hole Inverted Effective Mass, Applied Physics Letters, vol. 79, No. 22 (2001).

Qu et al., Long–Lived Phonons, Physical Review B, vol. 48, No. 9 (1993).

Pontius, et al., Size–Dependent Hot–Electron Dynamics in Small Pdn–Clusters, Journal of Chemical Physics, vol. 115, No. 22 (2001).

Smit et al., Enhanced Tunneling Across Nanometer–Scale Metal–Semiconductor Interfaces, Applied Physics Letters, vol. 80, No. 14 (2002).

Qiu et al., Long–Distance and Damping of Low–Frequency Phonon Polariton in LiNbO3, Physical Review B, vol. 56, No. 10 (1997).

Rousse et al, Non–Thermal Melting in Semiconductors Measured at Femtosecond Resolution, Nature, vol. 410 (2001).

Schelling et al., Phonon Wave–Packet Dynamics at Semiconductor Interfaces by Molecular–Dynamics Simulation, Applied Physics Letters, vol. 80, No. 14 (2002).

Shikin et al., Phase Accumulation Model Analysis of Quantum Well Resonances Formed in Ultra–Thin Ag, Au Films on W(110), Surface Science (2001).

Snow et al., Ultrathin PtSl Layers Paterned by Scanned Probe Lithography, Applied Physics Letters, vol. 79, No. 8 (2001).

Prabhu et al., Femtosecond Energy Relaxation of Nonthermal Electrons Injected in p–doped GaAs Base of a Heterojunction Bipolar Transistor, Journal of Applied Physics, vol. 90, No. 1 (2001).

Tsai et al., Theoretical Modeling of Nonequilibrium Optical Phonons and Electron Energy Relaxation in GaN, Journal of Applied Physics, vol. 85, No. 3 (1999).

Tripa et al., Surface–Aligned Photochemistry: Aiming Reactive Oxygen Atoms Along a Single Crystal Surface, Journal of Chemical Physics, vol. 112, No. 5 (2000).

Tripa et al., Surface–Aligned Reaction of Photogenerated Oxygen Atoms with Carbon Monoxide Targets, Nature, vol. 398 (1999).

Tripa et al., Kinetics Measurements of CO Photo–Oxidation on Pt(111), J. Chem. Phys. 105 (4) (1996).

Taylor et al., Strong Electron–LO Phonon Scattering and Hot Carrier Relaxation in GaN, Abstract No. ha249KW3.

Sun et al., Phonon–Pumped Terahertz Gain in n–Type GaAs/AlGaAs Superlattices, Applied Physics Letters, vol. 78, No. 22 (2001).

Tom et al., Coherent Phonon and Electron Spectroscopy on Surfaces Using Time–Resolved Second–Harmonic Generation.

Tiusan et al., Quantum Coherent Transpon Versus Diode-Like Effect in Semiconductor–Free Metal/Insulator Structure, Applied Physics Letters, vol. 79, No. 25 (2001).

Stromquist et al., The Dynamics of H Absorption in and Adsorption on Cu(111), Surface Science 397, pp. 382–394 (1998).

Weber et al., Carrier Capture Processes in GaAs–AlGaAs Quantum Wells Due to Emission of Confiend Phonons, Appl. Phys. Lett. 63 (22) (1983).

Wintterlin et al., Atomic and Macroscopic Reaction Rates of a Surface–Catalyzed Reaction, Science, vol. 278 (1997).

Yeo et al., Calorimetric HEats for CO and Oxygen Adsorptin and for the Catalytic CO Oxidation Reaction on Pt(111), J. Chem. Phys. 106 (1) (1997).

Witte et al., Low Frquency Vibrational Modes of Adsorbates, Surface Science, No. 1362 (2002).

Xu et al., Electrical Generation of Terahertz Electromagnetic Pulses by Hot–Electrons in Quantum Wells, Superlattices and Microstructures, vol. 22, No. 1 (1997).

Wanke et al., Injectorless Quantum–Cascade Lasers, Applied Physics Letters, vol. 78, No. 25 (2001).

Zhdanov, Vladimir P., Nm–Sized Metal Particles on a Semiconductor Surface, Schottky Model, etc., Surface Science, SUSC 2931 (2002).

Yeo et al., Calorimetric Investigation of NO and O adsorptin on Pd(100) and the Influence of Preadsorbed Carbon, J. Chem. Phys. 106 (5) (1997).

Zambelli et al., Complex Pathways in Dissociative Adsorption of Oxygen on Platinum, Nature, vol. 390 (1997).

Zhdanov et al., Substrate–Mediated Photoinduced Chemical Reactions on Ultrathin Metal Films, Surface Science 432 (1999).

Friedman et al., SiGe/Si THz Laser Based on Transitions Between Inverted Mass Light–Hole and Heavy–Hole Subbands, Applied Physics Letters, vol. 78, No. 4 (2001).

Harrison et al., The Carrier Dynamics of Terhertz Intersubband Lasers, Some Publishing Company (1999).

Harrison et al., The Carrier Dynamics of Far–Infrared Intersubband Lasers and Tunable Emitters, www.ee.leeds.sc.uk/homes/ph/.

Harrison et al., Theoretical Studies of Subband Carrier Lifetimes in an Optically Pumped Three–Level Terhertz Laser, Superlattices and Microstructures, vol. 23, No. 2 (1998).

Harrison et al., Room Temperature Populatin Inversion in SiGe TASER Designs.

Harrison et al., Population–Invension and Gain Estimates for a Semiconductor TASER.

Soref et al., Terahertz Gain in a SiGa/Si Quantum Staircase Utilizing the Heavy–Hole Inverted Effective Mass, Applied Physics Letters, vol. 79, No. 22 (2001).

Sun et al., Intersubband Lasing Lifetimes of SiGa/Si and Ga As/AlGaAs Multiple Quantum Well Structures, Appl. Phys. Letter 66 (25) (1995).

Sun et al., Phonon–Pumped Terhertz Gain in n–Type GaAs/AlGaAs Superlattices, Applied Physics Letters, vol. 78, No. 22 (2001).

Albano et al., Adsorption–Kinetics of Hot Dimers, SciSearch Databaseof the Institute for Scientific Information (1999).

Casassa et al., Time–Resolved Measurements of Vibrational Relaxatin of Molecules on surfaces: Hydroxyl Groups on Silica Surfaces, Journal of Vacuum Science & Technology A: Vacuum, Surfaces, and Films, vol. 3, Issue 3 (1985).

Cavanagh et al., Vibrational Relaxation of Adsorbed Molecules: Comparison with Relaxation Rates of Model Compunds, Journal of Vacuum Science & Technology A: Vacuum, Surfaces and Films, vol. 5, Issue 4 (1987).

Hyh et al., Methanol Oxidation of Palladium Compared to Rhodium at Ambient Pressures as Probed by Surface–Enhanced Raman and Mass Spectroscopies, Journal of Catalysis, vol. 174 (2) (1998).

Gumhalter et al., Effect of Electronic Relaxation on Convalent Adsorption Reaction Rates, Physical Review B, vol. 30, Issue 6 (1984).

Nolan et al., Surface Science, Direct Verification of a High–Translational–Energy Molecular Precursor to Oxygen Dissociation on Pd(111), Surface Science, vol. 419 (1998).

Phihal et al., Role of Intra–Adsorbate Coulomb Correlations in Energy Transfer a Metal Surfaces, Physical Review B, vol. 58, Issue 4 (1998).

Tully et al., Electronic and Phonon Mechanisms of vibrational Relaxation: CO on Cu(100), J. Vac. Sci. Technol. A 11(4) (1993).

Dimatteo et al., Enhanced Photogeneration of Carriers in a Semocnductor Via Coupling Across a Nonisothermal Nonascale Vacuum Gap, Applied Physics Letters, vol. 79, Issue 12 (2001).

Tripa et al., Surface–Aligned Photochemistry: Aiming Reactive Oxygen Atoms Along a Single Crystal Surface, The Journal of Chemical Physics, vol. 112, Issue 5 (2000).

Yates et al., Special Adsorption and Reaction Effects at Step Defect Sites on Platinum Single Crystal Surfaces (2000).

Dekorsy et al, Coherent Acoustic Phons in Semiconductor Superlattics, phys. stat. sp;. (b) 215, p 425–430 (1999).

Auerbach, Daniel J.; "Hitting the Surface—Softly"; Science, 294, (2001), pp. 2488–2489.

Bondzie, V. A., et al.;; "Oxygen adsorption . . . gold particles . . . TiO2(110)"; J. Vac. Sci. Tech. A., (1999) 17, pp. 1717 and figure 3.

Boulter, James; "Laboratory Measurement of OH . . . "; http://pearl 1.lanl.gov/wsa2002/WSA2002talks.pdf.

Chan H.Y.H., et al.; Methanol Oxidation On Palladium Compared To Rhodium . . . ; J. Catalysis v. 174(#2) pp. 191–200 (1998) (abstract and figure 1 only).
Chiang, T.–C.; Photoemission studies of quantum well states in thin films; Surf. Sci. Rpts.39 (2000) pp 181–235.
Chubb, D. L., et al; "Semiconductor Silicon as a Selective Emitter"; http://www.thermopv.org/TPV5–2–05–Chubb.pdf (abstract only).
Corcelli, S. A., et al.; "Vibrational energy pooling in CO on NaCl(100) . . . "; J. Chem. Phys.(2002) 116, pp. 8079–8092.
Danese, A., et al.; "Influence of the substrate electronic structure on metallic quantum well . . . "; Prog. Surf. Sol., 67, (2001), pp. 249–258.
Davis, J. E., et al.; "Kinetics and dynamics of the dissociative chemisorption of oxygen on Ir(111)"; J. Chem. Phys. 107 (3), (1997), pp 943–952.
Diekhoner, L., et al.; "Parallel pathways in methanol . . . Pt(111)"; Surf. Sci. 409 (1998) pp 384–391.
Diesing, D., et al.; "Aluminium oxide tunnel junctions . . . "; Thin Solid Films, vol. 342 (1–2) (1999) pp. 282–290.
Dimatteo, R. S., et al.; "Enhanced photogeneration of carriers . . . vacuum gap"; Appl. Phys. Let. (2001) 79, pp. 1894–1896.
Dimatteo, R. S., et al.; "Introduction to and Experimental Demonstration of Micron–gap ThermoPhotoVoltsics"; http://www.thermopv.org/37DiMatteo.html (abstract only).
Dogwiler, Urs, et al.; "Two–dimensional . . . catalytically stabilized . . . lean methane–air . . . "; Combustion and Flame, (1999), 116(1,2), pp 243–258.
Echenique, P. M., et al.; "Surface–state electron dynamics in noble metals"; Prog. Surf. Sci., 67, (2001), pp 271–283.
Endo, Makoto, et al.; "Oxidation of methanol . . . on Pt(111) . . . "; Surf. Sci. 441 ( 1999) L931–L937, Surf. Sci. Letters.
Fan, C. Y., et al.; "The oxidation of CO on RuO2 . . . "; J. Chem. Phys. 114, (2001), pp. 10058–10062.
Fann, W.S. , et al.; "Electron thermalization in gold"; Phys. Rev. B (1992) 46 pp. 13592–13595.
Gee, Adam T., et al.; "The dynamics of O2 adsorption on Pt(533) . . . "; J. Chem. Phys.(2000) 113, pp. 10333–10343.
Gergen, Brian, et al.; "Chemically Induced Electronic Excitations at Metal Surfaces"; Science,294, (2001) pp. 2521–2523.
Guliants, Elena A, et al.; "A 0.5$\mu$m–thick polycrystallins silicon Schottky . . . "; Appl. Phys. Let., (2002), 80, pp. 1474–1476.
Gumhalter, B., et al.; "Effect of electronic relaxation . . . adsorption reaction rate"; Phys. Rev. B (1984) 30 pp. 3179–3190.
Halonen, Lauri, et al.; "Reactivity of vibrationally excited methane on nickel . . . "; J. Chem. Phys.(2001) 115, pp. 5611–5619.
Hasegawa, Y., et al.; Modification of electron . . . standing wave . . . Pd . . . ; Surf. Sci., in press, Apr. 11 2002.
Henry, Claude R.; "Catalytic activity . . . nanometer–sized metal clusters"; Applied Surf. Sci., 164, (2000) pp 252–259.
Hess , S., et al.; "Hot Carrier Relaxation . . . Phonon Scattering in GaN"; http://www.physics.ox.ac.uk/rtaylon/images/hot%20carrier%620poster.pdf.
Ho, Wilson; http://www.lassp.cornell.edu/lassp_data/wilsonhe.html.
Hohlfeld, J, et al.; "Electron and lattice dynamics . . . optical excitation of metals"; Chemical Physics, 251 (2000) pp 237–258.

Honkala, KaroHina, et al.; "Ab initio study of O2 precursor states on the Pd(111) . . . "; J. Chem. Phys. (2001) 115, pp. 2297–2302.
Hou, H. ; Y., et al.; "Chemical Interactions of Super–Excited Molecules on Metal Surfaces"; http://www2.chem.ucsb.edu/wodtke/papers/dan1.pdf.
Hou, H., et al.; "Direct multiquantum relaxation of highly vibrationally excited NO . . . "; J. Chem. Phys., 110, (1999) pp 10660–10663.
Huang Y., et al.; "Observation of Vibrational Excitation and Deexicitation for NO from Au(111) . . . "; Phys. Rev. Lett., B4, (2000) pp 2985–2988.
Huang, Yuhui, et al.; "Vibrational Promotion of Electron Transfer"; SCIENCE, vol. 290, Oct. 6, 2000, pp 111–113.
IBH; "NanoLED overview"; http://www.ibh.co.uk/products/light_sources/nanoled_main.htm.
IBH; "Red picosecond laser sources"; http://www.ibh.co.uk/products/light_sources/nanoted/heads/red_laser_htm.
Iftimia, Ileans, et al.; "Theory . . . scattering of molecules from surface"; Phys. Rev. B (2002) 65, Article 125401.
Ishikawa, Yasuyuki, et al.; "Energetics of H2O dissociation and COads+OHads reaction . . . Pt.,"; Surf. Sci. preprints SUSC 12830, Apr. 27 2002.
Johnson, R. Colin ; "Molecular substitution . . . terabertz switch arrays"; BB Times, (Apr. 10, 2000, 3:35 p.m. EST) http://www.eet.com/story/OHG20000410S0057.
Kao, Chia–Ling, et al.; "The adsorption . . . molecular carbons dioxide on Pt(111) and Pd(111)"; Surf. Sci., (2001) Article 12570.
Katz, Gil, et al.; "Non–Adiabatic Charge Transfer Process of Oxygen on metal Surfaces"; Surf. Sci. 425(1) (1999) pp. 1–14.
Kawakami, R. K., et al.; "Quantum–well states in copper thin films"; Nature, 398, (1999) pp 132–134.
Kombda, T., et al.; "Lateral Hopping of Molecules Induced by Excitation of Internal Vibration . . . "; Science, 295, (2002) pp 2055–2058.
Lewis, Steven P., et al.; "Continuum Elastic Theory of Adsorbate Vibrational Relaxation"; J. Chem. Phys. 108, 1157 (1998).
Lewis, Steven P., et al.; "Substrate–adsorbate coupling in CO–adsorbed copper"; Phys. Rev. Lett. 77, 5241 (1996).
Li, Shenping, et al.; "Generation of wavelength–tunable single–mode picosecond pulses . . . "; Appl. Phys. Let. 76, (2000) pp 3676–3678.
Mitsui, T., et al.; "Coadsorption and interactions of O and H on Pd(111)"; Surf. Sci., Article 12767, (2002).
Moula, Md. Golam, et al.; "Velocity distribution of desorbing CO2 in CO oxidation on Pd(110) . . . "; Applied Surf. Sci., 169–170, pp 268–272 (2001).
Mulet, Jean–Phillippe, et al.; "Nanoscale radiative heat transfer between a small particle . . . "; Appl. Phys. Let., 78, (2001) p 2931.
Nienhaus, H, et al.; "Direct detection of electron–hole pairs generated by chemical reactions on metal surfaces"; Surf. Sci. 445 (2000) pp 335–342.
Nienhaus, H. ; "Electronic excitations by chemical reactions on metal surfaces"; Surf. Sci. Rpts. 45 (2002) pp 1–78.
Nienhaus, H., et al.; "Selective H atom sensors using ultrathin Ag/Si Schottky diodes"; Appl. Phys. Let. (1999) 74, pp. 4046–4048.
Nienhaus, Hermann; "Electron–hole pair creation by reactions at metal surfaces"; APS, Mar. 20–26, 1999, Atlanta, GA, Session SC33 [SC33.01].

Nienhaus, H, et al.; "Electron–Hole Pair Creation at Ag and Cu . . . of Atomic Hydrogen and Deuterium"; Phys. Rev. Lett., 82, (1999) pp. 446–449.

Nolan P. D., et al.; "Direct verification of . . . precursor to oxygen dissociation on Pd(111)"; Surf. Sci. v. 419(#1) pp. L107–L113, (1998).

Nolan, P. D., et al.; "Molecularly chemisorbed intermediates to oxygen adsorption on Pt . . . "; J. Chem. Phys. 111, (1999), pp 3696–3704.

Nolan, P. D., et al.; "Translational . . . Precursors to Oxygen Adsorption on Pt(111)"; Phys. Rev. Lett., 81, (1998) pp 3179–3182.

Ogawa, S., et al.; "Optical . . . and Femtosecond Dynamics in Ag/Fe(100) Quantum Wells"; Phys. Rev. Lett. 88, 116801 (2002).

Paggel, J. J., et al.; "Quantum–Well States as Fabry–Pérot Modes in a . . . "; Science, 283, (1999), pp 1709–1711.

Paggel, J. J., et al.; "Quasiparticle Lifetime . . . Ag/Fe(100) Quantum Wells"; Phys. Rev. Lett. (1998) 81, pp. 5632–5635.

Paggel, J.J., et al.; "Quantum well photoemission from stomically uniform Ag films . . . "; Applied Surf. Sci., 162–163, (2000), pp 78–85.

Rettner, C. T., et al; "Dynamics . . . chemisorption of O2 on Pt(111) . . . chemisorbed precursor . . . "; J. Chem. Phys. (1991) 94, pp. 1626–1635 (abstract only).

Rinnemo, Mats; "Catalytic Ignition and Kinetic Phase Transitions"; 1996; http://www2.1lb.chalmers.sc/cth/diss/doc/9596/RinnemoMats.html.

Robertson, A. J. B.; "Catalysis of Gas Reactions by Metals"; Logos Press Limited; 1970; LC #70–80936; pp. 1–5, 10, 41; Great Britain, Adlard & son Ltd.

Schewe, P., et al.; "CO2 Production at the Single–Molecule Level"; http://www.sip.org/enews/phyanews/2001/split/561-1.html.

Sheng, H. , et al.; "Schottky diode with Ag on (110) epitaxial ZnO film"; Appl. Phys. Let. (2002) 80, pp. 2132–2134.

Smit, G. D. J., et al.; "Enhanced tunneling across nonometer–scale metal–semiconductor Interfaces"; Appl. Phys. Let.(2002) 80, pp. 2568–2570.

Snow, E. S., et al.; "Ultrathin PtSi layers patterned by scanned probe lithography"; Appl. Phys. Let. (2001) 79, pp. 1109–1111.

Stipe, B. C., et al.; "Atomistic studies of O2 dissociation on Pt(111) induced by photons . . . "; J. Chem. Phys., (1997) 107 pp. 6443–6447.

Sun, C.-K., et al.; "Femtosecond studies of carrier dynamics in InGaN"; Appl. Phys. Let. (1997) 70 pp. 2004–2006.

Svensson, K., et al.; "Dipole Active Vibrational Motion in the Physiosorption Well"; Phys. Rev. Lett., 78, (1997) pp 2016–2019.

Tarver, Craig M. ; "Non–Equilibrium Chemical Kinetic . . . Explosive Reactive Flows"; Fall 1999 IMA, Workshop; High–Speed Combustion in Gaseous and Condensed–Phase.

Taylor, R.A., et al.; "Strong Electron–LO Phonon Scattering and Hot Carrier Relaxation in GaN"; http://www.physics.ox.ac.uk/rtaylor/images/ha249kw3.pdf.

Teodorescu, C.M., et al.; "Structure of Fe layers grown on InAs . . . "; Appl. Surf. Sci., 166, (2000) pp 137–142.

Tiusan, C., et al.; "Quantum coherent transport versus diode-like effect in . . . "; Appl. Phys. Let. 79, (2001) pp 4231–4233.

Tripa, C. Emil, et al.; "Surface–aligned photochemistry: Aiming reactive oxygen atoms . . . "; J. Chem. Phys., (2000) 112 pp. 2463–2469.

Tripa, C. Emil, et al.; "Surface–aligned reaction of photo-generated oxygen atoms with . . . "; Nature 398, pp 591–593 (1999).

Tripa, C. Emil; "Special Adsorption and Reaction Effects at Step Defect Sites on Plantinum . . . "; http://www.chem.p-itt.edu/thesis.html#tripa (abstract only).

Volkening, S., et al.; "CO oxidation on Pt(111)—Scanning tunneling microscopy experiments . . . "; J. Chem. Phys. (2001) 114, pp. 6382–6395.

Watson, D.T.P., et al.; "Isothermal and temperature–programmed oxidation of CH over Pt . . . "; Surf. Sci. preprint, year 2001.

Watson, D.T.P., et al.; "Surface products of the dissociative adsorption of methane on Pt . . . "; Surf. Sci. preprint, c. Oct. 2001.

Wilke, Steffen, et al.; "Theoretical investigation of water formation on Rh and Pt Surfaces"; J. Chem. Phys., 112, (2000) pp 9986–9995.

Wintterlin, J, et al; "Atomic . . . Reaction Rates . . . Surface–Catalyzed . . . "; Science, 278, (1997) pp. 1931–1934.

Wintterlin, J, R., et al.; "Existance of a "Hot" Atom Mechanism for the Dissociation of O2 on Pt(111)"; Phys. Rev. Lett., 77, (1996), pp 123–126.

Zambelli, T., et al.; "Complex pathways in dissociative adsorption of oxygen on platinum"; Nature 390, pp 495–497 (1997).

Zhdanov, V.P., et al.; "Substrate–mediated photoinduced chemical reactions on ultrathin metal films"; Surf. Sci., V. 432 (#3) pp L599–L603, (1999).

Zhdanov, Vladimir P.; "Nm–sized metal particles on a semiconductor surface, Schottky . . . "; Surf. Sci. PROFF SUSC 2931, Apr. 20 2002.

Zhukov, V. P., et al.; "Lifetimes of quasiparticle excitations in 4d transition metals . . . "; Phys. Rev. B (2002) 65, Article 115116.

Daniel J. Auerbach, Hitting the Surface Softly, www. sciencemag.org, vol. 294 Science, Dec. 21, 2001, pp. 2488–2489.

M.D. Cummings and A.Y Ele Zzabi, Ultrafast impulsive excitation of coherent longitudaL acoustic phonon oscillations inhighly photoexcited InSb, 2001 American Institute of Physics, vol. 79, No. 6, Aug. 6, 2001.

J.W. Gadzuk, Resonance–Assisted Hot Electron Femotochemistry at Surfaces, National Institute of Standards and Technology, Gathersburg, Maryland 20899, Physical Review Letters, vol. 76, No. 22, May 27, 1996.

Brian Gergen, Herman Nienhaus,W., Henry Weinberg, Eric W. McFarland, Chemically Induced Electronic Excitations at Metal Surfaces, www.sciencemag.org, vol. 294, Dec. 21, 2001, pp. 2521–2523.

H.Hou, Y.Huang, S.J. Guilding, C.T Rettner, D.J. Auerbach, A.M. Woodtke, Enhanced Reactivity of Highly Vibrationally Excited Molecules on Metal Surfaces, www.sciencemag.org, vol. 284, Jun. 4, 1999, pp. 1647–1650.

Y.Huang,C.T Rettner, D.J. Auerbach, A.M. Woodtke, Vibrational Promotion of Electron Transfer, sciencemag.org, vol. 290, Oct. 6, 2000, pp. 111–114.

Steven p. Lewis, Andrew M. Rappe, Controlling adsobate vibrational lifetimes using superlattices, 2001 The American Physical Society, Physical Review B, Bolume 63, 085402.

Henry Weinberg, Eric W. McFarland, A. Majumdar, B. Gergen, Herman Nienhaus,W.,H.S Bergh, Electron–Hole Pair Creation at Af and Cu Surfaces by Adsorption of Atomic Hydrogen and Deuterium, 1999 The American Physical Society, Physical Review Letters, vol. 82.

Henry Weinberg, Eric W. McFarland, A. Majumdar, B. Gergen, Herman Nienhaus,W.,H.S. Bergh, Direct detection of electron–hole pairs generated by vhemical reactions on metal surfaces, 2000 Elsevier Science B.V., Surface Science, pp. 335–342.

Xiaofeng, Fan, Gehong, Chris Labounty, and Bowers, John E., Croke, Edward, Ahn, Channing C., Huxtable, Scott, Majumdar, Arun, Shakouri, Ali; SiGec/Si superlattice microcoolers; Applied Phuscia Letters, vol. 78, No. 11, Mar. 12 2001; p: 1580–1582.

Friedman, L., Sun G., Soref, R.A.; SiGec/Si THz laser based on transitions between inverted mass light–hole and heavy-hole subbnads; Applied Physics Lettersl, vol. 78, No. 4, Jan. 22 2001; p: 401–403.

Harrison, P., Soref, R.A.; Population–inversion and gain estimates for semiconductor TASER.

Harrison, P., Soref, R.A.; Room temperature population inversion in SiGe TASER design.

Hohlfeld, J., Wellershoff, S.–S, J., Gudde, U., Conrad, V., Jahnke, E., Mattias; Electron and lattice dynamics following optical excitation of metals; Chemical Physics 251(2000), p: 237–258.

Hou, H., Huang, Y., Goulding, S.J., Retter, C.T., Auerbrach, D.J., Wodrke, A.M.; Direct multiquantum relaxation of highly vibrationally excited NO in collisiens with O/Cu(111); Journal of Chemical Physics, vol. 110, No. 22 Jun. 8, 1999, p. 10660–10663.

Jongma, Rienk T., Wodtke, Alec M.; Fast multiquantum vibrational relaxation of highly vibrationally excited O2; Journal of Chemical Physics; vol. 111, No. 24; Dec. 22 1999; pp: 10957–10963.

Kawakami, R.K., Rotenberg, E., Choi, Hyuk J., Hscorcia–Aparicio, Ernesto J., Bowen, M.O., Wolfe, J.H., Arenholz, B., Zhang, Z.D., Smith, N.V., Qiu, Z.Q., Quantumwell states in copper thin films; Letters to nature; vol. 398; Mar. 11, 1999; www.nature.com.

MD. Golam Moula, Surgio Wako, Gengyu Cao, Ivan Kobal, Yuichi Ohno, Tatsuo Matsushima; Velocity distribution of desorbin CO2 in CO oxidation ion Pd(110) under steady–state conditions; applied surface science; 169–170 (2001); pp: 268–272.

Jean–Philippe Mulet, Karl Joulain, Remi Carminati, and Jean–Jacques Greffet; Nanoscale radiative heat transfer between a small particle and a plane surface; Applied Physics Letters; vol. 78, No. 19; May 7 2001; pp: 2931–2933.

H. Niehaous et al., " Direct detection of electron–hole pairs generated by chemical reaction on metal surfaces", Surface Science 445 (2000), pp. 3350342.

H. Niehaus et al., " Selective H atom sensors using ultrathin Ag/Si Schottky diodes", Applied Physics Letters, vol. 74, No. 26, Jun. 28, 1999, pp. 4046–4048.

J.J Paggel et al., "Quantum–Well States as a Fabry–Perot Modes in a Thin–Film Electron Interferometer", www-.Sciencemag.org Science vol. 284 Mar. 12 1999, pp. 1709–1711.

J.J Paggel et al., " Quasiparticle Lifetime in Macroscopically Uniform Ag/Fe(100) Quantum Wells", Physical Review Letters, vol. 81, No. 25, Dec. 21 1998, pp. 5632–5635.

J.J Paggel et al., Quantum well photoemission from atomically uniform Ag films: determination of electonic band structure and quasi particle lifetime in Ag(100), Aplied Surface Science 162–163(2000), pp. 78–85.

N.Pontius et al.," Size–dependent hot–electron dynamics in small Pdn–cluster", Journal of Chemical Physics, vol. 115, No. 22, Dec. 8, 2001, pp. 10479–10483.

R.A Sorel et al., Terahertz gain in a SiGe/Si quantum staircase utilizing the heavy–hole inverted effective mass, Applied Phusics Letters, vol. 79, No. 22, Nov. 26 2001, pp. 3639–3641.

G. Sun et al., Phoson–pumped terahertz gain in n–type GaAs/AlGaAs Superlattices, Applied Physics Letters, vol. 78, No. 22, pp. 3520–3522.

V. P. Zhdanov et al., "Substrate–mediated photoinduced chemical reactions on ultrathin metal films", Surface Sciene 432 (1999), pp. L599–L603.

H. Park et al., "Nanomechanical oscillations in a single–C60 transistor", Letters to nature, vol. 407, Sep. 7, 2000, www.nature.com, pp. 57–60.

G. Sun et al., "Phonon Pumped SiGe/Si Interminiband Terahertz Laser", pp. 1–11.

G. Sun et al., "Phonon–pumped terahertz gain in n–type GaAs/Al GaAs superlattices", Applied Physics Letters, vol. 78, No. 22, May 28 2001, pp. 3520–3522.

K. Svensson et al., "Dipole Active Vibrational Motion in the Physisorption Well", Physical Review Letters, vol. 78, No. 10, Mar. 10 1997, pp. 2016–2019.

R. D. Vale et al., "The Way Things Move: Looking Under the Hood of Molecular Motor Proteins", Science, vol. 218, Apr. 7 2000, www.sciencemag.org, pp. 88–95.

W. Xu et al., Electrical generation of terahertz electromagnetic pulses by hot–electrons in quantum wells, Superlattices and Microstructures, vol. 22, Nov. 1, 1997, pp. 25–29.

G. Sun, R.A. Soref, J.B. Khurgin; "Phonon Pumped SiCe/Si Interminiband Terahertz Laser".

P. Armour et al., "Hot–electron transmission through metal interfaces: a study of Au/Fe/Au trilayers in GaAs substrates", Applied Surface Sciences 123/124 (1998), pp. 412–417.

C.D. Bezant et al., "Intersubband relaxation lifetimes in p–GaAs/AlGaAs quantum wells below the LO–phonon energy measured in a free electron laser experiment", Vacuum Solutions Online, Semicond. Sci. Technol. 14 No. 8 (Aug. 1999) L25–L28, PH: S0268–1242(99)03669–X.

L. Burgi et al., "Confinement of Surface State Electrons in Fabry–Perot Resonators", Physical Review Letters, vol. 81, No. 24, Dec. 14, 1998, pp. 5370–5373.

I. Campillo et al., "Inelastic lifetimes of hot electrons in real metals", Physical Review Letters, vol. 83, No. 11, Sep. 13, 1999, pp. 2230–2233.

Chiang, T.–C., "Photoemission studies of quantum well states in thin films", Surface Science Reports 39 (2000) pp 181–235.

De Paula, A. et al, "Carrier capture processes in semiconductor superlattices due to emission of confined phonons", J. Appl. Phys. 77 (12), 1995 pp 6306–6312.

Ree, J. et al., "Dynamics of Gas–Surface Interactions: Reaction of Atomic Oxygen with Chemisorbed Hydrogen on TUNGSTEN,"Journal of Physical Chemistry, vol. 101 (#25), pp. 4523–4534, Jun. 19, 1997.

Ree, J. et al., "Reaction of atomic oxygen with adsorbed carbon monoxide on a platinum surface," Journal of Chemical Physics, vol. 104, Issue 2, pp. 742–757, Jan. 8, 1996.

Nolan, P.D. et al., "Molecularly chemisorbed intermediates to oxygen adsorption on Pt(111): A molecular beam and electron energy–loss spectroscopy study," Journal of Chemical Physics, vol.111, No. 8, pp. 3696–3704, Aug. 22, 1999.

Nolan, P. D. et al., "Translation Energy Selection of Molecula Precursors to Oxygen Adsorption on Pt (111)," Physical Review Letters, vol. 81, No. 15, pp. 3179–3182, Oct. 12, 1998.

Murphy, M. J. et al., "Inverted vibrational distributions from N2 recombination at Ru(001): Evidence for a metastable molecular chemisorption well," Journal of Chemical Physics, vol. 110, No. 14, pp. 6954–6962, Apr. 8, 1999.

Kim, M. S. et al., "Reaction of Gas–Phase Atomic Hydrogen with Chemisorbed Hydrogen Atoms on an Iron Surface," Bull. Korean Chem. Soc., vol. 18, No. 9 , pp. 985–994, May 22, 1997.

Bonn, M. et al., "Phonon–Versus Electron–Mediated Desorption and Oxidation of CO on Ru(0001)," Science, vol. 285, pp. 1042–1045, Aug. 13, 1999. www.sciencemag.org.

Nolan, P. D. et al., "Direct verfication of a high–translational–energy molecular precursor to oxygen dissociation on Pd(111)," Surface Science Letters, vol. 419, pp. L107–L113, Sep. 24, 1998.

Davis, J. E. et al., "Kinetics and dynamics of the dissociative chemisorption of oxygen on Ir(111)," Journal of Chem. Phys., vol. 107(3), pp. 943–952, Jul. 15, 1997.

Tripa, C. Emil et al., "Surface–aligned reaction of photogenerated oxygen atoms with carbon monoxide targets," Nature, vol. 398, pp. 591–593, Apr. 15, 1999, www.nature.com.

Shin HK, "Vibrationally excited OD Radicals from the Reaction of Oxygen–Atoms with Chemisorbed Deuterium on TUNGSTEN," Journals of Physical Chemistry, vol. 102(#13), pp. 2372–2380, Mar. 26, 1998.

Tripa, C. Emil et al., "Kinetics meaurements of CO photo-oxidation on Pt(111)," Journal of Chemical Physics, vol. 105, Issue 4, pp. 1691–1696, Jul. 22, 1996.

Tripa, C. E. et al., "Kinetics measurements of CO photo-oxidation on Pt(111)," J. Chem. Phys., vol. 105, No. 4, Jul. 22 1996, pp. 1691–1696, expecially the disclosure beneath the paragraph header "C. Cross section determination methods" on p. 1693.

Nolan, P. D. et al., "Molecularly chemisorbed intermediates to oxygen adsorption on Pt(111): A molecular beam and electron energy–loss spectroscopy study," J. Chem. Phys., vol. 111, No. 8, Aug. 22 1999, pp. 3696–3707, especially figure 9 and the description of figure 9 set forth on p. 3702, 2nd full paragraph et seq.

Ree, J. et al., "Reaction of atomic oxygen with adsorbed carbon monoxide on a platinum surface," J. Chem. Phys., vol. 104, No. 2, Jan. 08 1996, pp. 742–757, particularly the abstract and p. 753.

Diesing, D. et al., "Aluminium oxide tunnel junctions: influence of preparation technique, sample geometry and oxide thickness," Thin Solid Films 342 (1999), pp. 282–290, received Feb. 26 1998; accepted Sep. 11 1998.

G.H. Takaoka et al., "Preparation and catalytic activity of nano–scale Au islands supported on TiO2", Nuclear Instruments & Methods in Physics Research, Section—B: Beam Interactions with Materials and Atoma, North–Holland Publishing Company, Amsterdam, NL, vol. 121, No. 1, 1997, pp. 503–506, XP004057973, abstract.

P. Avouris et al., "Electron–Stimulated Catalysis Device", IBM Technical Disclosure Bulletin, vol. 25, No. 12, May 1, 1983, pp. 6378–6379, New York, US, XP002219954.

Frese, et al., "Analysis of Current/Voltage Curves at n–Si/$SiO_2$/Pt Electrodes", J. Electrochem. Soc., Dec. 1994, pp. 3375–3382, vol. 141, No. 12, The Electrochemical Society, Inc.

Frese, et al., "Methanol Oxidation at p–Si/Pt Electrodes, Evidence for Hot Hole Reactivity", J. Phys. Chem., 1995, pp. 6074–6083, vol. 99, American Chemical Society.

Gadzuk, "Multiple Electron Processes in Hot–Electron Femtochemistry at Surfaces", http://www.cstl.njst.gov/div837/837.03/highlite/gadzuk1999.htm.

Frese, et al., "Hot Electron Reduction at Etched a–Si/Pt Thin Film Electrodes", J. Electrochem. Soc., Sep. 1994, pp. 2402–2409, vol. 103, The Electrochemical Society Inc.

Gaillard, et al., "Hot Electron Generation in Aqueous Solution at Oxide–Covered Tantalum Electrodes, Reduction of Methylpyridinium and Electrogenerated Chemiluminescence of Ru(bpy)$_3^{2+}$", J. Phys. Chem., 1999, pp. 667–674, vol. 103, American Chemical Society.

Sung, et al., "Demonstration of Electrochemical Generation of Solution–Phase Hot Electrons at Oxide–Covered Tantalum Electrodes by Direct Electrogenerated Chemiluminescence", J. Phys. Chem., 1998, pp. 9797–9805, vol. 102, American Chemical Society.

Zhdanov, et al., "Substrate–mediated photoinduced chemical reactions an ultrathin metal films", Surface Science, 1999, pp. L599–L603, vol. 432, Elsevier Science B.V.

Achermann, M. et al., "Carrier dynamics around nano–scale Schottky contacts: a femtosecond near–field study", Applied Surface Science 7659 (2002) 1–4.

Aeschlimann, M. et al., "Competing nonradiative channels for hot electron induced surface photochemistry", Chemical Physics, Apr. 15, 1996, pp. 127–141, vol: 205, Issue: 1–2.

Aeschlimann, M. et al., "Ultrafast electron dynamics in metals", The Ultrafast Surface Science Group, http://www.ilp.physik.uni–essen.do/aeschlimann/2y_photo.htm.

Auerbach, D. et al., "Reagent Vibrational Excitation: A Key to Understanding Chemical Dynamics at Surfaces ?", abstract only.

Balandin, A. et al., "Significant decrease of the lattice thermal conductivity due to phonon confinement in a free-standing semiconductor quantum well", Physical Review B, Jul. 15, 1998, vol. 58, Issue 3, pp. 1545–1549.

Balandin, A. et al., "Effect of phonon confinement on the thermoelectric figure of merit of quantum wells", Journal of Applied Physics, Dec. 1, 1998, vol. 84, Issue 11, pp. 6149–6153.

Bonn, M. et al., "Phonon– Versus Electron–Mediated Desorption and Oxidation of CO on Ru(0001)", Science, vol. 285, No. 5430, Issue of Aug. 13 1999, pp. 1042–1045.

Chang, Y. et al., "Coherent phonon spectroscopy of GaAs surfaces using time–resolved second harmonic generation", Chemical Physics, 251/1–3, pp. 283–308, (2000).

Chen,–C. et al., "Hot electron reduction at n–Si/Au thin film electrodes", Journal–of–the–Electrochemical–Society, vol. 139, Nov. 1992, pp. 3243–3249.

Choi, C.K. et al., "Ultrafast carrier dynamics in a highly excited GaN epilayer", Physical Review B, vol. 63, 115315, Mar. 15 2001, 6 pages.

Debernardi, A. et al., "Anharmonic Phonon Lifetimes in Semiconductors from Donalty–Functional Perturbation Theory", Physical Review Letters, vol. 75, No. 9, Aug. 28, 1995, pp 1819–1822.

Delfatti, N. et al., "Temperature–dependent electron–lattice thermalization in GaAs", Physical Review B, Feb. 15 1999–1, vol. 59, No. 7, pp 4576–4579.

Denzler, D.N., et al., "Surface femtochemistry: Ultrafast reaction dynamics driven by hot electron mediated reaction pathways", Femtochemistry and Femtobiology: Ultrafast Dynamics in Molecular Science, (World Scientific 2002).

Diesing, D. et al., "Surface reactions with hot electrons and hot holes in metals", Surface Science, 331–333, 1995, pp. 289–293.

Driskill–Smith, A. A. G. et al., "The "nonotriode:" A nanoscale field–emission tube", Applied Physics Letters, Nov. 1, 1999, vol. 75, Issue 18, pp. 2845–2847.

Fan, C. Y. et al., "The oxidation of CO on $RuO_2$—110—at room temperature", Journal of Chemical Physics, vol. 114, No. 22, Jun. 8 2002, P 10058.

Frese, K.W., Jr. et al., "Hot electron reduction at etched n–Si/Pt thin film electrodes", Journal–of–the–Electrochemical–Society, vol. 141, Sep. 1994, pp. 2402–2409.

Funk, S. et al., "Desorption of CO from Ru—001—induced by near–infrared femtosecond laser pulses", Journal of Chemical Physics, vol. 112, No. 22, Jun. 8 2000, pp. 9888–9897.

Gadzuk, J. W., "Resonance–assisted hot electron femtochemistry at surfaces", Physical Review Letters, May 27, 1996, vol. 76, Issue 22, pp. 4234–4237.

Gadzuk, J. W., "Multiple Electron Processes in Hot–Electron Femtochemistry at Surfaces", http://www.cstl.nist.gov/div837/837.03/highlite/gadzuk1999.htm.

Gadzuk, J. W., "Surface Femtochemistry with Fast Lasers and Slow Nanostructures", http://www.ostl.nist.gov/div837/837.03/highlite/previous/dietmim.htm.

Gaillard, F. et al., "Hot electron generation in aqueous solution at oxide–curved tantalum electroles, Reduction of methylpyridinium and electrogenerated chemiluminescence of $Ru(bpy)_3^{2+}$", Journal of Physical Chemistry B vol. 103, No. 4, Jan. 28, 1999, pp. 667–674.

Gao, S., "Quantum kinetic theory of vibrational heating and bond breaking by hot electrons", Physical Review B, vol. 55, No. 3, Jan. 15, 1997–1, pp. 1876–1886.

Gergen, B. et al., "Chemically Induced Electronic Excitations at Metal Surfaces", Science, vol. 294, No. 5551, Issue of Dec. 21 2001, pp. 2521–2523.

Guo, J. et al., "The desorption yield dependence on wavelength of femtosecond laser from CO/Cu(111)", Annual Meeting of the American Physical Society, Mar. 1999, Atlanta, GA; Session BC18—Surfaces (General), ORAL session, Mar. 21; Room 258W, GWCC[BC18.06].

Hess, S. et al., "Hot Carrier Relaxation by Extreme Electron—LO Phonon Scattering in GaN", http://www.physics.ox.ac.uk/rtaylor/images/hol%20carrier%20poster.pdf.

Hofer, U., "Self–Trapping of Electrons at Surfaces", Science, vol. 279, No. 5348, Issue of Jan. 9 1998, pp. 190–191.

Katz, G. et al., "A theoretical study of hole induced desorption", Journal of Chemical Physics, Oct. 22, 1999, vol. 111, Issue 16, pp. 7593–7598.

Lee, B. C. et al., "Transmission of longitudinal optical phonons through a barrier in uniaxial crystals", Physical Review B, vol. 65, 153315, Apr. 15 2002.

Nonolite, "Nanolite Sparkflashlamp", http://www.hsps.com/products/nanolaen.htm.

Nienhaus, H., "Electronic excitations by chemical reactions on metal surfaces", Surface Science Reports, 45, (2002), pp. 1–78.

Plihal, M. et al., "Role of intra–adsorbate Coulomb correlatins in energy transfer at metal surfaces", Physical Review B, Jul. 15, 1998, vol. 58, Issue 4, pp. 2191–2206.

Pontius, N. et al., "Size–dependent hot–electron dynamics in small Pd–clusters", Journal of Chemical Physics, Dec. 8, 2001, vol. 115, Issue 22, pp. 10479–10483.

Prybyla, J. A. et al., "Femtosecond time–resolved surface reaction: Desorption of CO from Cu(111) in < 325 fsec", Physical Review Letters, Jan. 27, 1992, vol. 68, Issue 4, pp. 503–506.

Rinnemo, M., "Catalytic Ignition and Kinetic Phase Transitions", http://www2.lib.chalmers.se/cth/diss/doc/9596/RinnemoMats.html.

Saalfrank, P. et al., "Quantum dynamics of bond breaking in a dissipative environment: Indirect and direct photodesorption of neutrals from metals", J. Chem. Phys. 105 (6), Aug. 8 1996, pp. 2441–2454.

Sung,–Y.–E., et al., "Enhancement of electrochemical hot electron injection into electrolyte solutions at oxide–covered tantalum electrodes by thin platinum films", Journal of Physical Chemistry B., vol. 102, No. 49, Dec. 3, 1998, pp. 9806–9811.

White, J. M., "Using photons and electrons to drive surface chemical reactions", Journal of Molecular Catalysis A: Chemical 131, 1998, pp. 71–90.

Zhdanov, V.P. et al., "Substrate–mediated photoinduced chemical reactions on ultrathin metal films", Surface Science, vol. 432 (#3), pp. L599–L603, Jul. 20, 1999.

Zhu, X.–Y., "Surface photochemistry: from hot reactions to hot materials", Surface Science, vol. 390, (1997), pp. 224–236.

Frese, K.W. Jr. et al., "Methanol Oxidation at p–Si/Pt Electrodes. Evidence for Hot Hole Reactivity", J. Phys. Chem., Jan. 24, 1995, pp. 6074–6083, vol. 99, No. 16.

Frese, K.W., Jr. et al., "Analysis of Current/Voltage Curves at n–Si/$SiO_2$/Pt Electrodes", J. Electrochem. Soc., Dec. 1994, pp. 3375–3382, vol., 141, No. 12.

Frese, K. W., Jr. et al., "Hot electron reduction at etched n–Si/Pt thin film electrodes," Journal of the Electrochemical Society, vol. 141, No. 9, Sep. 1994, pp. 2402–2409.

Mahan, G. D. et al., "Multilayer thermionic refrigerator and generator," Journal of Applied Physics, vol. 83, No. 9, May 1 1998.

Stipe, B. C. et al., "Atomistic studies of $O_2$ dissociation on Pt(111) induced by photons, electrons, and by heating," J. of Chem. Phys., vol. 107 (16), Oct. 22, 1997, pp. 6443–6447.

Tripa, C. E. et al., "Surface–aligned reaction of photogenerated oxygen atoms with carbon monoxide targets," Nature, vol. 398, Apr. 15, 1999, pp. 591–593.

Agranovich, V. M. et al., "New concept for organic LEDs: non–radiative electronic energy transfer from semiconductor quantum well to organic overlayer", Elsevier Science, Synthetic Metals, 2001, vol. 116, pp. 349–351.

Bonn, M. et al., "Phonon–Versus Electron–Mediated Desorption and Oxidation of CO on Ru(0001)," Science, vol. 285, No. 5430, Issue of Aug. 13 1999, pp. 1042–1045.

Davis, J. E. et al., "Kinetics and dynamics of the dissociative chemisorption of oxygen on Ir(111)," J. Chem. Phys., 107 No. 3, Jul. 15 1997, pp. 943–951.

Gadzuk, J. W., "Hot–electron femtochemistry at surfaces: on the role of multiple electron processes in desorption," Chemical Physics, vol. 251, year 2000, pp. 87–97.

Ge, N.-H. et al., "Femtosecond Dynamics of Electron Localization at Interfaces," Science, vol. 279, No. 5348, Issue of Jan. 9 1998, pp. 202–205.

Gao, Shiwu, "Quantum kinetic theory of vibrational heating and bond breaking by hot electrons," Physical Review B, vol. 55, No. 3, Jan. 15 1997–I, pp. 1876–1886.

Hou, H. et al., "Enhanced Reactivity of Highly Vibrationally Excited Molecules on Metal Surfaces," Science, vol. 284, No. 5420, Issue of Jun. 4 1999, pp. 1647–1650.

Nienhaus, H. et al., "Direct detection of electron hole pairs generated by chemical reactions on metal surfaces," Surface Science 445 (2000) pp. 335–342.

Nienhaus, H. et al., "Selective H atom sensors using ultrathin Ag/Si Schottky diodes," Applied Physics Letters, Jun. 28, 1999, vol. 74, Issue 26, pp. 4046–4048.

Gaillard, Frederic et al., "Hot electron generation in aqueous solution at oxide–covered tantalum electrodes. Reduction of methylpyridinium and electrogenerated chemiluminescence of Ru(bpy)32+," Journal of Physical Chemistry B., vol. 103, No. 4, Jan. 28 1999, pp. 667–674.

Engstgrom, Ulrika and Ryberg, Roger, "Comparing the vibrational properties of low–energy modes of a molecular and an atomic adsorbate: CO and O on Pt (111)," Journal Of Chemical Physics, vol. 112, No. 4, Jan. 22, 2000, pp. 1959–1965.

Nolan, P. D. et al., "Molecularly chemisorbed intermediates to oxygen adsorption on Pt ( 111 ): A molecular beam and electron energy–loss spectroscopy study," Journal Of Chemical Physics, vol. 111, No. 8, Aug. 22 1999.

Nolan P. D. et al., " Direct verification of a high–translational–energy molecular precursor to oxygen dissociation on Pd(111)," Surface Science vol. 419, pp. L107–L113, Dec. 24, 1998.

Otto, Andreas et al., "Role of atomic scale roughness in hot electron chemistry," Journal of Physical Chemistry B, vol. 103, No. 14. Apr. 8, 1999, pp. 2696–2701.

Plihal, M. et al., "Role of intra–adsorbate Coulomb correlations in energy transfer at metal surfaces," Physical Review B, vol. 58, No. 4, Jul. 15, 1998, pp. 2191–2206.

Sung, Yung–Eun et al., "Enhancement of electrochemical hot electron injection into electrolyte solutions at oxide–covered tantalum electrodes by thin platinum films," Journal of Physical Chemistry B., vol. 102, No. 49, Dec. 3 1998, pp. 9806–9811.

Zhdanov, V. P. et al., "Substrate–mediated photoinduced chemical reactions on ultrathin metal films," Surface Science, vol. 432 (#3), pp. L599–L603, Jul. 20, 1999.

Nienhaus, H., "Electron–hole pair creation by reactions at metal surfaces," American Physical Society, Centennial Meeting Program, Mar. 20–26, 1999, Atlanta, GA, Session SC33—Metal Surfaces: Adsorbates. http://www.aps.org/meet/CENT99/HAPS/.

Nienhaus, H et al., "Electron–Hole Pair Creation at Ag and Cu Surfaces by Adsorption of Atomic Hydrogen and Deuterium," Physical Review Letters, vol. 82, Issue 2, Jan. 11, 1999, pp. 446–449.

SURFACE CATALYST INFRA RED LASER

CROSS-REFERENCE TO RELATED APPLICATIONS

This application is a division of application Ser. No. 09/691,948, filed Oct. 19, 2000, which claims the benefit of the U.S. Provisional Patent Application No. 60/160,527 filed on Oct. 20, 1999, and which is a continuation-in-part of U.S. patent application No.: 09/589,669 filed on Jun. 7, 2000 now U.S. Pat. No. 6,327,859, which is a divisional application of U.S. patent application Ser. No. 09/304,979 filed on May 4, 1999, now U.S. Pat. No. 6,114,620.

TECHNICAL FIELD OF THE INVENTION

The present invention relates generally to solid-state devices for converting or extracting energy from hydrocarbon-oxidizer reactions. More specifically, this invention relates to a significant improvement of the process for the efficient conversion and extraction of energy in the form of optical emissions and of coherent radiation and from reactants such as hydrocarbons, hydrogen or other combustible materials reacting on a catalyst surface with air or other oxidizers.

BACKGROUND OF THE INVENTION

One method to convert chemical reactant energy directly into useful work such as electricity uses electrochemical couples such as batteries and fuel cells. In this method, a substantial fraction of the reactant bond energies may be converted directly into electrical potential. However, the physical chemistry underlying these processes limits the rate of such conversion substantially. The result is a power per mass and power per volume that is orders of magnitude smaller than that of a mechanical engine.

Another method uses gas dynamic processes to convert chemical energy directly into a dynamic state exhibiting a population inversion. The energy is extracted from this system as coherent radiation. However, the reactants and exhausts of this method are usually dangerous and incompatible with human safety considerations. Moreover, these devices cannot be efficiently miniaturized.

Therefore, it is highly desirable to have a simpler method and system for extracting efficiently without having to use harmful products and without producing hazardous byproducts in the process.

A recent research suggests that certain simple, energetic atoms reacting on a catalytic surface produce products exhibiting a population inversion. An inverted population is the prerequisite for stimulated emission of radiation, which is one method to remove the energy from the reaction and to retain its high degree of usefulness.

One problem in the prior state of technology is the process of creating highly energetic species on the catalyst surface, such as hot atoms and mono-atomic oxygen, that 1) retain a significant amount of the chemical energy for reactions, instead of dissipating it as a heat of adsorption, and 2) that will produce an inverted population as a product of the reaction. The issue in the creation of hot atoms, such as mono-atomic oxygen, is that it usually takes more electrical energy to produce the hot atoms than can be extracted from the resulting chemical reactions.

Research has suggested that mono-atomic, energetic specie reacting with simple adsorbed specie may form vibrationally inverted products, and that this inversion may occur in many systems. For example, research has shown that when gas phase oxygen atoms react with deuterium adsorbed on a tungsten surface, OD radicals are formed in the inverted state, with the highest population appearing at vibrational level 6. This represents a substantial fraction of the available reaction energy being concentrated in the inverted state. Shin, H K, "Vibrationally Excited OD Radicals From The Reaction Of Oxygen-Atoms With Chemisorbed Deuterium On Tungsten," Journal Of Physical Chemistry A, v. 102(#13), pp. 2372–2380, Mar. 26, 1998.

Similar research showed that gas phase atomic oxygen reacting with adsorbed hydrogen on the surface produces population inverted, OH radicals within 100 femtoseconds. Ree J, Kim Y H, Shin H K, "Dynamics Of Gas-Surface Interactions: Reaction Of Atomic Oxygen With Chemisorbed Hydrogen On Tungsten," Journal Of Physical Chemistry A, V. 101(#25), pp. 4523–4534, Jun. 19, 1997.

It was shown in Kim, M. S. and J. Ree, "Reaction of Gas-Phase Atomic Hydrogen with Chemisorbed Hydrogen Atoms on an Iron Surface," Bulletin of the Korean Chemical Society, Volume 18, Number 9 (1997), COMMUNICATIONS, pp 985–994, that gas phase atomic hydrogen reacts with chemisorbed hydrogen on an iron surface to form population inverted, desorbed diatomic hydrogen molecules.

It is known that when atomic oxygen in the gas phase reacts with carbon monoxide adsorbed on a platinum catalyst surface, the fraction of reactive collisions producing molecules having vibrational energies corresponding to levels $v3=9$ to 13 is found to be very high and exhibits a vibrational population inversion. Ree, J. ; Y. H. Kim, and H. K. Shin, "Reaction of atomic oxygen with adsorbed carbon monoxide on a platinum surface," Journal of Chemical Physics, Jan. 8, 1996, Volume 104, Issue 2, pp. 742–757. This would be useful except for the fact that the mono-atomic oxygen atoms for this reaction must be created using inefficient means, namely electric arcs.

Yet another research has shown that mono-atomic oxygen atoms can be created directly on a catalytic surface by irradiation with UV light. The most probable result of such irradiation is the production of mono-atomic oxygen atoms. The next most probable result is desorption. The issue with this approach is the low efficiency of the generation and conversion of UV light into dissociated oxygen atoms. Tripa, C. Emil, Christopher R. Arumaninayagam, John T. Yates, Jr., "Kinetics measurements of CO photo-oxidation on Pt(111)," Journal of Chemical Physics, Jul. 22, 1996, Volume 105, Issue 4, pp. 1691–1696.

A related research has also shown that oxygen molecules preferentially adsorb on the step sites of a catalyst such as platinum, and that photo generated mono-atomic oxygen atoms preferentially react with other radicals or molecules also adsorbed on the step sites. Atomic and molecular species generated by the photolysis of aligned molecules adsorbed on crystalline solids tend to move preferentially in particular directions relative to the crystal surface. For example, photo-generated mono-atomic oxygen reacts preferentially with adsorbed CO to make excited state CO2. The feature here is the efficiency of reaction of the hot atoms with other surface reactants. An issue here is the preferential production of hot atoms. Tripa, C. Emil; John T. Yates Jr, "Surface-aligned reaction of photo generated oxygen atoms with carbon monoxide targets," Nature, Vol 398, pages 591–593 (1999), 15 Apr. 1999.

Another research showed that the UV photons create hot electrons on a catalyst metal surface and which interact strongly with adsorbed oxygen to cause the trapped oxygen atoms to dissociate or desorb. The salient point is that adsorbates trap in metastable states before they dissociate, and that hot electrons can stimulate such states efficiently. Experiments showed that gas phase oxygen molecules adsorb first as a superoxo-like specie (molecule singly charged on surface) and are then trapped in a shallow barrier of order 0.1 eV. Then the molecule may overcome the barrier and become a peroxo-like specie (doubly charged) in a barrier of order 0.5 eV. Finally, the molecule may overcome this barrier and dissociate into hot atoms. The existence of precursor phases is apparently fairly common and observed in various forms of platinum, palladium and iridium catalysts. Nolan, P. D. ; B. R. Lutz, P. L. Tanaka, J. E. Davis, and C. B. Mullins, "Molecularly chemisorbed intermediates to oxygen adsorption on Pt (111): A molecular beam and electron energy-loss spectroscopy study," Journal Of Chemical Physics Volume 111, Number 8, 22 Aug. 1999. Nolan P D, Lutz B R, Tanaka P L, Mullins C B, "Direct verification of a high-translational-energy molecular precursor to oxygen dissociation on Pd(111)," Surface Science v. 419(#1) pp. L107–L113, Dec. 24, 1998. Nolan, P. D.; B. R. Lutz, P. L. Tanaka, J. E. Davis, and C. B. Mullins, "Translational Energy Selection of Molecular Precursors to Oxygen Adsorption on Pt(111)," Physical Review Letters , VOLUME 81, NUMBER 15 12 Oct. 1998. Davis, J. E. ; P. D. Nolan, S. G. Karseboom, and C. B. Mullins, "Kinetics and dynamics of the dissociative chemisorption of oxygen on Ir(111)," J. Chem. Phys. 107 (3), 15 Jul. 1997, pp943, 10 pages.

Inverted products can be formed by associative desorption. Experiments have shown that nitrogen molecules formed upon catalytic decomposition of ammonia (cracking) over Ru may show a vibrational population inversion. The associative reaction begins with the atomic separation of the nitrogen atoms being similar to that of the surface catalyst atoms and just slightly greater than that of the ground state of a product nitrogen molecule. Murphy, M. J. ; J. F. Skelly, and A. Hodgson; B. Hammer, "Inverted vibrational distributions from N2 recombination at Ru(001): Evidence for a metastable molecular chemisorption well," Journal of Chemical Physics—Apr. 8, 1999—Volume 110, Issue 14, pp. 6954–6962.

That reaction rates can be stimulated and increased by many orders of magnitude with picosecond duration and timing is illustrated by recent experiments depicted in a technical publication. Bonn, M. ; S. Funk, Ch. Hess, D. N. Denzler, C. Stampfl, M. Scheffler, M. Wolf, G. Ertl, "Phonon- Versus Electron-Mediated Desorption and Oxidation of CO on Ru(0001)," Science, Volume 285, Number 5430 Issue of 13 Aug. 1999, pp. 1042–1045.

The stretched molecule represents the initial condition where the atomic separation during the vibrational oscillation starts with the association reaction at the extrema, defining a reaction product in the highest excited state. It is noted "Vibrational" modes also include the vibration of any specie on the surface against that surface.

Simple reactant radicals on the catalyst surface may preferentially form in mechanically simple ways, which often strongly favor a single vibrational mode for the energy to concentrate, again favoring an inverted population. Furthermore, mono-atomic oxygen atoms supplied externally to the catalytic surface may cause a population inversion in the products of carbon monoxide reaction to carbon dioxide and in the surface catalyzed oxidation of hydrogen.

Heretofore, the oxygen adsorption process wasted approximately half the reaction energy as heat on the catalyst surface. Therefore, a new method to conserve such energy and extract it into useful energy is highly desired.

SUMMARY OF THE INVENTION

The present invention is directed to a method and system for using a catalyst and reactants to create the "simple, energetic atoms" needed for the generation of the inverted population. In one embodiment, the present invention captures the reaction energy based on the principle that some energetic atoms reacting on a catalytic surface produce products exhibiting a population inversion.

This invention creates population inverted reaction products from fuel and oxidizer reactions on a catalyst surface. A laser operating on the inverted population would efficiently extract the energy from the system. One embodiment uses the hot atom produced during dissociative adsorption of oxygen on catalyst surfaces to provide energetic oxygen free radicals on those surfaces and to cause direct and prompt reaction with a fuel specie, also on the catalyst surface, which biases reactions towards formation of population inverted products. Examples of fuel specie include, but are not limited to, hydrogen, a hydroxyl, a carbon monoxide or a hydrocarbon fragment.

Another embodiment of this invention creates a population inversion by biasing the reaction by choice of catalyst species to form product molecules that are stretched at the moment of desorption from the catalyst surface. Another embodiment creates the population inversion by biasing the reactants by choice of catalyst to cause simple reactants with a large fraction of their energy available upon associative desorption. Another embodiment uses a solid-state method to provide hot electrons directly, and without the use of UV light, which in turn stimulates dissociation of the precursor, peroxo-chemisorbed oxidizer, and cause an avalanche of surface reactions.

In one embodiment, the present invention uses a laser to extract the energy from an inverted population, resulting in conversion of a substantial fraction, and in some cases a majority, of the chemical reaction energy into one or several, nearly monochromatic, coherent beams of light. Such a beam retains the high quality of the energy and is most useful because it can be efficiently converted into electricity, for example, by passing a monochromatic beam into a photovoltaic cell with band gap slightly smaller than the beam photon energy, and equally efficiently into mechanical forces through other means.

BRIEF DESCRIPTION OF THE DRAWINGS

Preferred embodiments of the present invention will now be described, by way of example only, with reference to the accompanying drawings in which.

DETAILED DESCRIPTION OF THE PREFERRED EMBODIMENT OF THE INVENTION

Figure 1:
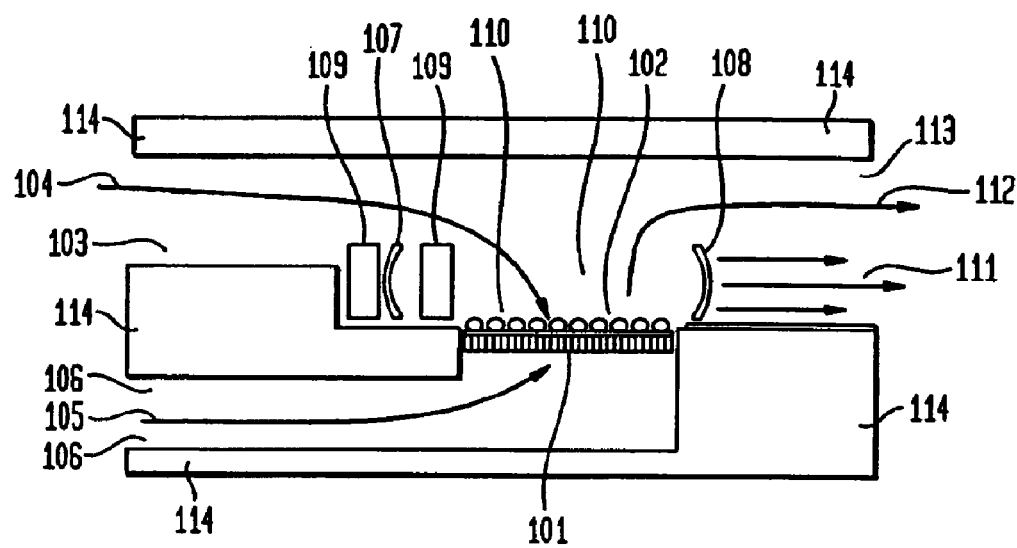
FIG. 1 shows a schematic cross section of an apparatus for energy generation using separated reactants in one embodiment of the present invention.

The present invention is directed to biasing the reactions occurring on the surface of a catalyst toward those that deliver a substantial fraction of the energy into product species that exhibit, as a result of the methods of this invention, a population inversion.

Stretched molecules associated with adsorption and desorbtion have closely related, reversible effects, both related to population inversion. A method of the present invention in one embodiment uses the hot atoms created upon dissociative chemisorption reacting with a fuel-rich catalyst surface; in another embodiment, a method in the present invention uses stretched molecules produced during associative desorbtion from a catalyst surface; in yet another embodiment, the method of the present invention uses excited state simple products either desorbing from catalyst surfaces or vibrating on those surfaces for a usefully long time; all methods being capable of producing reaction products with population inversions.

According to one embodiment of this invention a catalyst surface is flooded with fuel, such as ethanol, methanol, alchohols or gaseous products of a hydrocarbon reformer. The products of hydrocarbon reformer may include, but are not limited to, CO and H2. A catalyst is chosen such that all or nearly all the reactants adsorb on the catalyst surface. Many catalysts satisfy these criteria, especially the platinum group catalysts. The fuels chemisorb and dissociate into simple radicals on the catalyst surface, such as a platinum catalyst. Under favorable conditions, such as when the catalyst surface is cooled or when the mixture is fuel-rich, the adsorbed fuel molecules will occupy most of the surface sites and leave relatively few sites for oxygen adsorption. The oxygen, upon adsorption under these conditions, dissociates via a process where it is observed that nearly the entire dissociation energy is shared equally between two, monoatomic oxygen atoms, or free radicals, each moving away from the dissociation site with approximately 1 electron volt ("eV") of energy, that is, with nearly all the chemisorption dissociation energy. These free radicals with 1 eV of kinetic energy are referred to as "hot atoms."

In the present invention, such hot atoms almost exclusively find adsorbed fuel radicals as the first, nearest and next nearest collision partners, because the catalyst surface is flooded with fuel. Accordingly, the hot atom free radical places non-thermal energy directly into the chemical reaction coordinate and promptly reacts with the collision partner, as a result of having approximately 1 eV of energy, which is approximately twice the measured activation energy (typically 0.5 eV) needed to initiate the reaction, and forms reaction products that are by necessity born in their highest excited vibrational state.

According to the present invention, a hot atom formed from the dissociation process is made to react before it can reach equilibrium on the catalyst surface and thereby does not dissipate the energy as heat to the substrate or catalyst lattice but instead makes nearly all of the energy of adsorption available for population inversion.

In one embodiment of the present invention, the use of a surface with approximately a monolayer or greater coverage of fuel reactant also reduces the adsorption energy of the oxygen adsorbed species, which adsorption heat would otherwise become unavailable to reaction products.

The present invention is also directed to extracting the energy from the multiple quantum levels associated with the vibrational energy of newly formed product species, whether or not the specie remains adsorbed on the surface of the catalyst. The multiple quantum transitions are all dipole active for specie on a surface.

In one embodiment of the present invention, an optical system, for example, a laser, causes stimulated emission of radiation to occur between the highly populated, higher vibrational quantum number energy levels and the sparsely populated, lower quantum number levels, and thereby removes a substantial fraction of the energy in the form of coherent radiation.

In one embodiment, a photovoltaic device may transform the radiation emitted due to the population inversion directly into electricity, with or without the use of lasers.

The laser may use overtone transitions between levels, resulting in multiples, e.g., double, triple or higher, of the transition frequencies usually associated with single level transitions.

This can be accomplished by the use of an optical cavity tuned to an overtone transition, for example, spanning 2, 3 or more vibrational transitions of the excited state reaction product, and optically enclosing the surface reaction zone. The excited state products are typically hydroxyl, a water molecule, a Carbon Monoxide, or carbon dioxide specie.

Another way to accomplish this is to use sequential laser stimulation pulses of different frequencies to control and sequence the transitions of the inverted product specie. The radiation is amplified each time it passes through the inverted medium. Such a sequence of input radiation sequentially depopulates selected inverted levels of the multi-level vibrational energy levels of the inverted products.

The state of the art of making laser cavities permits geometries that are favorable to having reactants and chambers within optical resonance region. One way to do this is to form a laser cavity from a photonic band gap cylinder cavity, wherein the cavity is formed by confinement of light within a hollow core (a large air hole) in a silica-air photonic crystal fiber.

In one embodiment of the present invention, the use of overtone transitions magnifies the frequency or energy difference between upper level transitions and lower level transitions and hence allows this invention to select such transitions and to sequence their stimulation and emission. That is, the stimulated emission may be stimulated first between the highest levels, then between medium levels and on down to lower levels, in sequence. The anharmonic nature of the potential well associated with the multi-level transitions of the chemical reaction products causes energy level spacing of upper level transitions to become closer compared to lower level transitions as the energy level approaches the top of the potential well, which permits differentiation and selection of desired transitions.

In one embodiment, use of the strong electric fields found at the catalyst surface breaks the symmetry, induces molecular polarization and causes otherwise forbidden molecular transitions such as multiple overtone transitions of adsorbed, vibrationally excited products, to exhibit strong dipole transition matrix elements. This in turn permits multi-quantum transitions and renders these transitions to be active candidates for stimulated emission.

The present invention also provides a way to insert the reacting species on to the surface so that the infrared absorptions of the reactants absorb the least possible fraction of the desired emissions, resulting in a net increase in the efficiency of the system.

In one embodiment, the fuel species, known for broadband long wavelength infra red absorbtions, may be inserted from a porous substrate, from within tubes, and/or from channels that reflect IR radiation at the laser frequencies, and where such tubes may have micro-meter or nano-meter holes drilled into them to permit fluid flow, and where such tubes or channels may have catalyst clusters or layers placed on their surfaces. One such a system is a wicking fuel delivery system. This system would include a fuel bed, which can be a wetted material such as metal wool or fibers wetted by fuel or a channel of fuel, and a porous substrate whose surface includes catalyst or catalyst clusters. The porous substrate is in contact with the wicking system. The substrate may be a zeolite, an aerogell, or an aerogell or other suitable substrate permeated with holes such as may be drilled with a laser.

In one embodiment, the use of overtone radiation may place the predominant frequency of the cavity out of range and significantly above the spectral regions associated with intense IR absorption.

The present invention is also directed to causing adsorbed molecular species in excited states to extend the vibrational lifetimes of the product specie so that the vibration energy is minimally dissipated into the lattice during the energy extraction process.

In one embodiment, the substrate upon which the catalyst clusters reside may be a non-conductor, wherein using the non-conductor has been shown to increase the lifetime of certain vibrating specie by orders of magnitude over that of the same species on a conducting substrate.

In one embodiment, the substrate may be chosen so that the vibration frequencies of the substrate mismatch those of the catalyst. This isolates and decouples the superlattice vibrations from the substrate vibrations. This increases the lifetime of a product in an excited state on that surface. Such material may include, for example, chemical vapor deposited diamond, with very high relative phonon frequencies, or in another example lead, with very low phonon frequencies.

The present invention is also directed to causing reaction avalanches, which in turn may be used to cause high peak power pulses of coherent radiation. In one embodiment of the present invention, specie such as the peroxo precursor adsorbed oxygen molecules are stimulated to dissociate upon electrical command using hot electrons generated by a solid state forward biased diode. In such a diode, the catalyst is the metal electrode and diode element of a metal-semiconductor, Schottky diode. When the metal element has a thickness less than a few times the energy mean free path of electrons in that diode, those electrons injected into the metal due to a forward bias are formed as hot electrons with energy at least the same order of magnitude as the sum of the forward bias and the Schottky barrier height.

These intermediate peroxo species have an activation barrier against dissociation of order 0.3 electron volts. Typical dissociative adsorption activation barriers for such trapping mediated adsorbates are of order 0.1 to 0.6 electron volts. The typical Schottky barrier of a diode formed between the metals platinum, palladium, tungsten, copper, silver and gold and a semiconductor such as silicon are typically of order 0.5 volts. A forward bias of 0.5 volts would flood the surface of the catalyst and its adsorbates with 1 eV hot electrons.

In one embodiment of the present invention, limiting the stimulation electron energy not only causes a triggering of the transition of the adsorbate precursor states to dissociation but also biases the triggering so the transition does not go backwards, towards desorption. If the adsorbate does go backwards, limiting the stimulation electron energy increases the fraction that go the desired direction. The appropriate value for the stimulation energy is a value less than the energy of the dissociation barrier. A good choice of energy is also above that of the barrier to the state just before dissociation. For example, for peroxo state oxygen on platinum, the barriers have a difference of order 0.2 eV. The ideal hot electrons produced by our invention would have an energy spread less than this difference, for example of 0.2 eV, and an absolute value within the reactivity range for the adsorbed state, for example, of order 0.1 to 1 eV.

Another method to bias the absorbtions of radiation favoring the dissociation path is to enhance the vibration levels of that specie, such as a peroxo-chemisorbed specie. To do this, the present invention may use an optical cavity to enhance that radiation. For example, peroxo-chemisorbed oxygen on platinum has a 690 per centimeter (infra red optical) resonance. An optical source of such radiation, such as produced by an electrical discharge or by a diode laser, would selectively stimulate this resonance.

Yet another method may provide such optical radiation in a manner that can be sequenced both in frequency and in time. A chirped laser is a method to do this. Some of the radiation that is produced by the method and apparatus of this invention may be tailored to be this desired radiation.

According to the present invention, other specie on the catalyst surface, such as fuel molecules or radicals may be used as hot electron absorbers. As such, they would dissociate into radicals themselves or transfer energy to the peroxo- and superoxo-chemisorbed oxygen precursors, to stimulate the reaction avalanche.

In one embodiment, when control over the timing of reaction initiation is desired, the catalyst may be chosen to have a charged precursor with higher activation barriers against dissociation, a condition which normally makes a catalyst less active.

In one embodiment, the power conversion device of the present invention using hot atoms may include:

substrate(s) such as the catalyst itself, silica, alumina, titania, semiconductor, or convenient materials on which a catalyst, such as platinum nanoclusters, is placed;

a means of flooding the catalyst surface with fuel, such as a porous substrate fed with liquid fuel;

a mechanism of bringing air as the oxidizer into the chamber, such as a channel permitting air input and reaction product exhaust to flow over the catalyst surface;

hydrocarbon reactant fuel, such as liquid ethanol, methanol, higher alchohols, or the product of hydrocarbon reformers, such as mixtures containing hydrogen and carbon monoxide;

a poly-chromatic, resonant optical cavity enclosing the catalyst surface reaction region; and a laser system using the optical cavity to extract coherent radiation from the inverted population of reaction products.

According to one embodiment, the hot atoms produce associated reactants born in their highest vibrational states, obviating the need to supply such monatomic specie externally.

In some reactant-oxidizer-catalyst cases the reactants, such as hydroxyl radicals, desorb immediately, which places them in a long-lived state (approximately 200 picoseconds between collisions with other gas molecules, and lifetimes of 10 to 100 collisions) compared to lifetimes on the catalyst metal surface (1 to several picoseconds). The laser system in this case stimulates transitions to remove the vibrational energy. The hydroxyl will not find many other hydroxyls with which to resonantly exchange energy, thereby precluding rapid thermalization via resonant collisional exchange of the molecular vibrational excitations.

In other cases the products, typically vibrationally excited OH or CO, may remain on the catalyst surface, and in this case the lifetime of the vibrations would be of order picoseconds. In this case the catalytic surface electric field causes multiquantum transitions to become more strongly dipole active, and the laser system may now induce transitions on the second, third or 4th overtone, for example of the excited state OH or CO. With turnover numbers of order 10,000 per site per second, typical of good catalysts operating in their desired operating conditions, a 100 layer per centimeter ("cm") reaction chamber would yield 100 watts per cubic centimeter of inverted population. This permits stimulated emission under conditions that would otherwise be too difficult.

FIG. 1 schematically shows a cross section of a device to implement some of these concepts. In FIG. 1, a substrate 101 on which a catalyst 102 is affixed, where a gas flow channel 103 guides air 104 over the catalyst 102. The catalyst substrate 101 is porous and permits the flow of fuel 105 from the fuel side of the substrate 101, which liquid or gaseous fuel is guided to the substrate 101 by the fuel channel 106. A polychromatic resonant optical cavity, formed by laser mirror 107 and laser output mirror 108, a laser control system 109, and the greater optical cavity 110, enclose the region of catalytic surface reactions 110 and extract energy in the form of coherent light 111. Exhaust 112 leaves the system and flows through the exit channel 113. Structural materials 114 support these elements and form the fuel, air and exhaust channels.

In another embodiment, the present invention uses stretched molecule associative desorbtion or excited state products desorbing from catalyst surfaces. In this embodiment, a power conversion device may include:

substrate(s) such as the catalyst itself, silica, alumina, titania, a semiconductor or well chosen materials on which a similarly well chosen catalyst is placed;

a mechanism for bringing fuel and air (the oxidizer), into the chamber, such as a channel permitting reactant input and reaction product exhaust to flow over the catalyst surface;

liquid ethanol, methanol, higher alchohols, or the product of hydrocarbon reformers, such as mixtures containing hydrogen and carbon monoxide, as the hydrocarbon reactant fuel;

a poly-chromatic, resonant optical cavity enclosing the catalyst surface reaction region; and a laser system using the optical cavity to extract coherent radiation from the inverted population of reaction products.

According to this embodiment, combinations of reactant and catalyst, which have been chosen to favor production of inverted products, are caused to flow into the reaction chamber containing the catalyst surfaces and where the optically enclosing resonant cavity and its associated laser system extracts a significant fraction of the product reaction energy as radiation. The products are then exhausted and removed from the optically enclosed system, which removes ground state species and maintains the population inversion.

One way to achieve this has the optical cavity enclosing only a region close to the catalyst surface, that is, to use a surface laser, while permitting gas flow out of the surface region. The state of the art of surface lasers, such as disc lasers and single mode photonic band gap systems permits such cylinder symmetry, air hole systems.

Also, catalysts may be chosen according to the method wherein the catalyst exhibits a "pressure gap," as it is referred to in the technical literature. As is the case with CO oxidation on Ruthenium, the oxygen rich adsorption lowers the oxygen heat of adsorption, permitting the desired oxidation and making Ru one of the most active catalysts, whereas the characterizations performed under ultra high vacuum conditions show Ru to be one of the least catalytic.

In this embodiment, one may tailor the properties of the desired catalyst. It has been observed that otherwise catalytically inactive metals, such as gold, are caused to become reactive, and relatively good catalysts, as the number of underlying metal layers is decreased, down to 1 and 2 monolayers, for example.

At 6 or more monolayers, the affinity of gold for dissociation of oxygen has been observed to be negligible. As the number of monolayers decreases to 3 or 2, the affinity is sufficient to dissociate oxygen, but not to bind it too strongly to the gold metal, making the 2 monolayer catalyst efficient. At 1 monolayer the affinity of the gold substrate catalyst for oxygen is so strong that the oxygen becomes unavailable for reaction.

In one method to choose catalysts of the present invention, a method of tailoring and choosing the catalyst favoring a stretched molecule may include:

creating a list of catalyst candidates from the entire set of metals;

choosing the catalyst metals with the interatomic spacing of catalyst atoms such that the reaction product exit channel would form a product with a stretched bond;

forming a catalyst cluster including atomic monolayers in a cluster of nanometers dimension on an oxide substrate;

choosing the number of monolayers to control the affinity for both oxygen and fuel.

For example, choose a gold catalyst of 2 monolayers thickness placed on titania to favor carbon monoxide oxidation.

Figure 2:
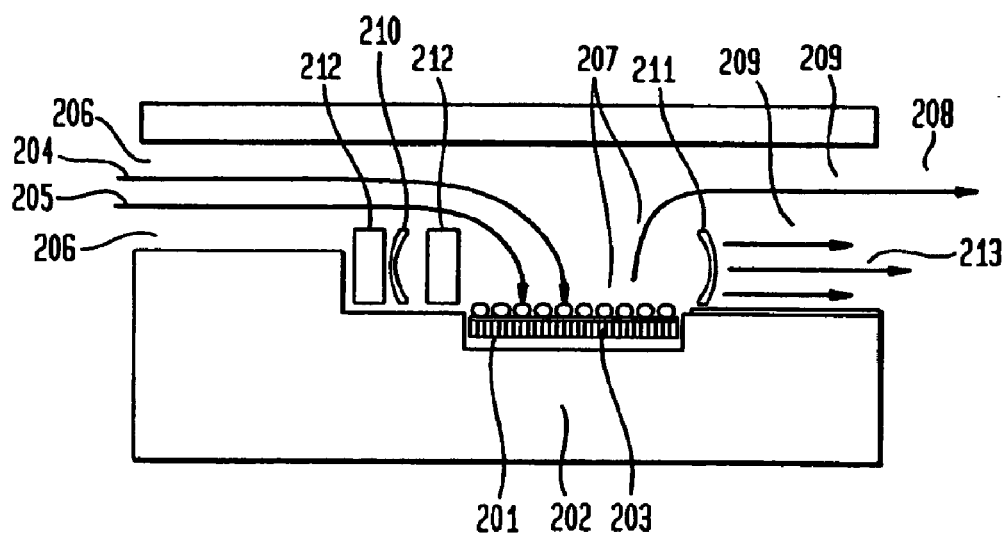
FIG. 2 illustrates a cross section of an apparatus in one embodiment of the present invention for generating energy using free flowing, mixed reactants for forming inverted excited state products.

FIG. 2 shows a cross section of an apparatus to implement some of these concepts. FIG. 2 shows a substrate 201 resting on a support 202 and on which a catalyst 203 is affixed, causes fuel 204 and air 205 entering from the input channel 206 to react, excited state products to be formed and radiate in the reaction channel 207, and causes exhaust 208 to leave via the exhaust channel 209. A polychromatic resonant optical cavity, formed by laser mirror 210 and laser output mirror 211, a laser control system 212, and the greater optical cavity and reaction zone 207, enclose the region of catalytic surface reactions and extract energy in the form of coherent light 213.

In another embodiment, the present invention favoring the stimulation and timing of reaction avalanches may include:

a chamber similar to the one used in the previous embodiment;

a semiconductor substrate and catalyst forming a Schottky diode, with catalyst thickness less than or approximately equal to a few times the energy mean free path of electrons in the metal;

a mechanism providing a pulsed forward bias on the diode.

In one embodiment, a short-pulse light source such as a laser may also be used to provide the hot electrons to energize the trapped adsorbate. For example, such a light source will cause a chemisorbed peroxo-like doubly charged oxygen molecular specie on a platinum catalyst to accelerate its transition over the approximately 0.29 eV barrier, where the molecular specie preferentially moves so as to dissociate. This favors dissociation because the reverse reaction, creation of the super-oxo-like, singly charged molecular oxygen, has a higher activation barrier energy, and the physi-sorbed specie has an even higher activation barrier. The laser may provide the fastest and shortest pulses. Alternatively a hot electron injector diode may be used.

According to one embodiment, pulsing the diode with 0.5 to 1 volt for short times, such as fractions of a picosecond, raises the energy of a large fraction of the doubly charged molecular oxygen to the level needed to dissociate.

The hot electrons created upon such instantaneous heating of a metal on a thermal insulating substrate may be used in a regenerative feedback mode to further stimulate the peroxo-like specie. In this way, a very small amount of initial stimulator energy may be needed, compared to the energy output of the system.

Figure 3:
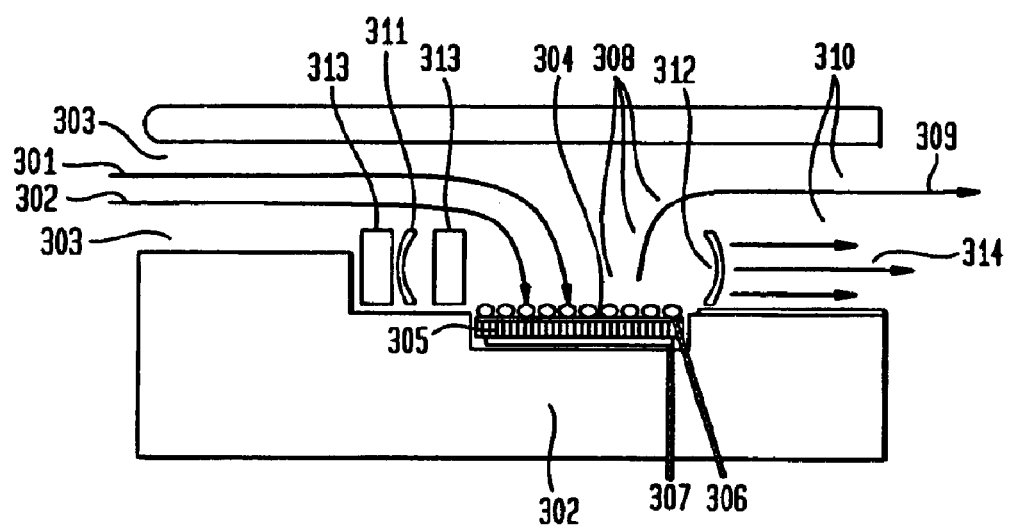
FIG. 3 illustrates a cross section of an apparatus in one embodiment for generating power by externally stimulating and triggering reactions.

FIG. 3 shows a cross section of an apparatus to implement some of these concepts. FIG. 3 shows reactions on the catalyst surface are stimulated to occur in pulses, concentrating the subsequent radiated energy in a small time. A fuel 301 and air 302 mixture enter the reaction zone through the input channel 303 and contact the catalyst surface 304 and physisorb, chemisorb or adsorb. The catalyst 304 and the semiconductor substrate 305 form a Schottky diode. The thickness of the catalyst 304 is of order 1 to 5 nanometers, which is less than the mean free path of electrons in preferred catalysts such as platinum, palladium, tungsten, rhodium, ruthenium, copper, silver or gold.

A short electrical pulse with positive on the catalyst electrode 306 and negative on the semiconductor ohmic contact 307 causes a forward bias and a forward current in the diode formed by the catalyst—semiconductor element. The electrons of this forward current have an excess energy approximately equal to and in excess of the forward bias voltage, and these flood the catalyst surface, initiating a chemical reaction avalanche. The hot electrons cause adsorbed, chemisorbed molecular species trapped in precursor states to surmount their activation barriers and adsorb as atomic specie on the catalyst surface.

The electrical trigger pulse causes the reactants to react all at once and together, causing orders of magnitude increase in the concentration of products, such as excited state specie radiating in the reaction channel 308. Exhaust 309 leaves via the exhaust channel 310.

A laser formed by laser mirror 311 and laser output mirror 312, a laser control system 313, and the greater optical cavity and reaction zone 308, enclose the region of catalytic surface reactions and extract energy in the form of coherent light 314.

While the invention has been particularly shown and described with respect to a preferred embodiment thereof, it will be understood by those skilled in the art that the foregoing and other changes in form and details may be made therein without departing from the spirit and scope of the invention. For example, those skilled in the art will appreciate that the features of the invention may sometimes be used to advantage without a corresponding use of the other features shown or described herein above. Similarly, some features may be combined, within the scope and equivalents of the present invention, to achieve a desired result.

We claim:

1. An apparatus to extract energy from a chemical reaction by using hot atom reactions, comprising:

a porous substrate;

a catalyst placed on the substrate for allowing reactions to occur on a surface of the catalyst; and at least two optical elements placed near opposite ends of the surface and forming an optical cavity in a region of catalytic surface reaction, the at least two optical elements operable to extract laser energy from the reactions; and at least a first wall surrounding the catalyst surface forming a first channel between the catalytic surface and the first wall, the region of catalytic surface reaction being exposed to the first channel, the first channel being a conduit through which reactants enter the region of catalytic surface reaction, wherein the catalyst includes a nanocluster on an oxide substrate.

2. The apparatus of claim 1, wherein the nanocluster includes gold on titania, or a metal on an oxide, or combinations thereof.

3. An apparatus to extract energy from a chemical reaction by using hot atom reactions, comprising:

a porous a substrate;

a catalyst placed on the substrate for allowing reactions to occur on a surface of the catalyst; and at least two optical elements placed near opposite ends of the surface and forming an optical cavity in a region of catalytic surface reaction, the at least two optical elements operable to extract laser energy from the reactions; and at least a first wall surrounding the catalyst surface forming a first channel between the catalytic surface and the first wall, the region of catalytic surface reaction being exposed to the first channel, the first channel being a conduit through which reactants enter the region of catalytic surface reaction, wherein the porous substrate includes zeolite or aerogell material or combinations thereof.

4. An apparatus to generate hot atoms, comprising:

a porous substrate;

a catalyst placed on the substrate for allowing reactions to occur on a surface of the catalyst, the catalyst including at least one or more nano-islands of catalyst deposited with thickness less than a penetration depth of optical radiation extracted from the apparatus;

at least two optical elements placed near opposite ends of the surface and forming an optical cavity in a region of catalytic surface reaction, the at least two optical elements operable to extract laser energy from the reactions; and at least a first wall surrounding the catalyst surface forming a first channel between the catalytic surface and the first wall, the region of catalytic surface reaction being exposed to the first channel, the first channel being a conduit through which reactants enter the region of catalytic surface reaction.

5. The apparatus of claim 4, wherein inter-island spacing of the one or more nano-islands of catalyst is at least several atomic dimensions.

6. The apparatus of claim 5, wherein catalyst island dimensions are at least less than a quarter wavelength of radiation extracted from the apparatus.

7. An apparatus to generate hot atoms, comprising:
a porous substrate;
a catalyst placed on the substrate for allowing reactions to occur on a surface of the catalyst;
at least two optical elements placed near opposite ends of the surface and forming an optical cavity in a region of catalytic surface reaction, the at least two optical elements operable to extract laser energy from the reactions; and
at least a first wall surrounding the catalyst surface forming a first channel between the catalytic surface and the first wall, the region of catalytic surface reaction being exposed to the first channel, the first channel being a conduit through which reactants enter the region of catalytic surface reaction, wherein the porous substrate includes a non-conducting substrate favoring fuel adsorption, and the catalyst includes one or more nanometer dimension catalyst islands favoring oxygen adsorption.

8. The apparatus of claim 7, wherein the non-conducting substrate includes aluminum oxide, silicon oxide, titanium oxide, or ionic salts, or combinations thereof.

9. An apparatus to generate hot atoms, comprising:
a porous substrate;
a catalyst placed on the substrate for allowing reactions to occur on a surface of the catalyst; and
at least two optical elements placed near opposite ends of the surface and forming an optical cavity in a region of catalytic surface reaction, the at least two optical elements operable to extract laser energy from the reactions; and
at least a first wall surrounding the catalyst surface forming a first channel between the catalytic surface and the first wall, the region of catalytic surface reaction being exposed to the first channel, the first channel being a conduit through which air enters the region of catalytic surface reaction.

10. The apparatus of claim 9, wherein the catalyst is Platinum, Iridium, Rhodium, Ruthenium, Palladium, Tungsten or a transition metal, or combinations thereof.

11. The apparatus of claim 9, wherein the catalyst includes catalyst islands of gold on titanium oxides.

12. The apparatus of claim 9, wherein the porous substrate includes a dielectric reflector.

13. The apparatus of claim 9, wherein the substrate is a non-conducting ionic solid.

14. The apparatus of claim 9, wherein the optical cavity further includes a dichroic resonator.

15. The apparatus of claim 9, wherein exhausts from the reaction leave the region via the first channel.

16. The apparatus of claim 9, wherein the optical elements include:
a first laser mirror disposed adjacent to one end of the substrate; and
a second laser mirror disposed adjacent to an opposite end of the substrate, the first and the second laser mirrors forming the optical cavity in the region of catalytic surface reaction.

17. An apparatus to generate hot atoms, comprising:
a porous substrate;
a catalyst placed on the substrate for allowing reactions to occur on a surface of the catalyst;
at least two optical elements placed near opposite ends of the surface and forming an optical cavity in a region of catalytic surface reaction, the at least two optical elements operable to extract laser energy from the reactions;
at least a first wall surrounding the catalyst surface forming a first channel between the catalytic surface and the first wall, the region of catalytic surface reaction being exposed to the first channel, the first channel being a conduit through which reactants enter the region of catalytic surface reaction; and
a second wall surrounding a bottom side of the porous substrate that is opposite the catalytic surface, the second wall and the bottom side forming a second channel between the second wall and the bottom side, wherein reactants are enabled to enter the region via the second channel and the porous substrate.

18. An apparatus to extract optical energy from a chemical reaction, comprising:
one or more porous substrates capable of permitting a flow of reactants through the one or more porous substrates;
one or more catalysts formed on the substrate, at least one of the one or more catalysts exhibiting a potential barrier to chemical reactants on the catalyst, the potential barrier causing a slowing effect of at least one of dissociation upon adsorption on the catalyst, charge acquisition by the chemical reactants on the catalyst, and further chemical reaction on the catalyst;
a supply of one or more chemical reactants selected from those known to produce hot atoms from the one or more reactants reacting with the one or more catalyst and to cause simple, vibrationally energetic molecules to be generated as a result of the hot atoms reacting with the one or more reactants or reaction products;
one or more means of cooling one or more surfaces of the one or more catalysts formed on the substrate, to enhance the slowing effect of the potential barrier;
one or more reaction initiators;
one or more channels to convey reactants to and exhausts away from the one or more surfaces;
an optical system coupled to a region including the vibrationally energetic molecules and configured to extract optical energy from the vibrationally energetic molecules.

19. The apparatus of claim 18, wherein the one or more catalysts include Platinum, Iridium, Rhodium, Ruthenium, Palladium, Tungsten, or a transition metal, or combinations thereof.

20. The apparatus of claim 18, wherein the one or more catalysts include a nanocluster no more than several monolayers thick on an oxide substrate.

21. The apparatus of claim 20, wherein the nanocluster includes gold on titania or a metal on an oxide, or combinations thereof.

22. The apparatus of claim 18, wherein the one or more catalyst includes catalyst islands of gold on titanium oxides.

23. The apparatus of claim 18, wherein the one or more substrates includes zeolite or aerogell materials or combinations thereof.

24. The apparatus of claim 18, wherein the one or more substrates includes a dielectric reflector.

25. The apparatus of claim 24, wherein one or more nano-islands of catalyst are deposited with thickness less than a penetration depth of optical radiation extracted from the apparatus.

26. The apparatus of claim 25, wherein inter-island spacing of the one or more nano-islands of catalyst is at least several atomic dimensions.

27. The apparatus of claim 26, wherein catalyst island dimensions are at least less than a quarter wavelength of radiation extracted from the apparatus.

28. The apparatus of claim 18, wherein the one or more substrates includes a non-conducting substrate favoring fuel adsorption, and one or more of the one or more catalysts includes one or more nanometer dimension catalyst islands favoring oxygen adsorption, wherein a product of a reaction occurring on the a catalyst migrates to reside on and reacts with a product of the fuel adsorbed on the non-conducting substrate.

29. The apparatus of claim 28, wherein the non-conducting substrate includes aluminum oxide, silicon oxide, titanium oxide, or ionic salts, or combinations thereof.

30. The apparatus of claim 18, wherein the one or more substrates is a non-conducting ionic solid.

31. The apparatus of claim 18, wherein the optical cavity further includes a dichroic resonator.

32. The apparatus of claim 18, further including:

a first wall along a catalyst surface side of the one or more substrates, forming a first channel between the one or more substrates and the first wall, the first channel defining a reaction region and allowing one or more reactants to enter the reaction region via the first channel.

33. The apparatus of claim 32, wherein exhausts from the reaction region leave the reaction region via the first channel.

34. The apparatus of claim 32, further including:

a second wall along a bottom side of the one or more substrates, the bottom side being a side opposite the catalytic surface side of the one or more substrates, the second wall and the bottom side forming a second channel between the second wall and the bottom side, wherein one or more reactants are enabled to enter the reaction region via the second channel through the one or more substrates.

35. The apparatus of claim 18, wherein the optical system includes:

a first laser mirror disposed adjacent to one end of one or more of the one or more substrates;

a second laser mirror disposed adjacent to an opposing end of the one or more substrates, the first and the second laser mirrors forming an optical cavity in the region of catalytic surface reaction.

36. The apparatus of claim 18, wherein the one or more reactants include at least an oxygen present in air and a fuel including at least carbon monoxide or hydrogen or both, a ratio of the fuel to the oxygen rendering the one or more reactants oxygen-rich.

37. The apparatus of claim 18, wherein the one or more catalysts are formed on the one or more substrates with features differing from an atomically smooth monolayer.

38. The apparatus of claim 35, further including:

means for stimulating emission from highly vibrationally excited molecules, which stimulating begins with stimulating transitions downward from highest energy vibrational levels and ends with stimulating emissions downward from lower energy levels; and means to chirp resonance of the optical cavity in a sequence starting from a frequency corresponding to a higher energy level to a frequency corresponding to a lower energy level.

39. The apparatus of claim 38, further including:

means for supplying a frequency chirped, time sequenced stimulation radiation to a region including reaction products.

40. The apparatus of claim 18, further including:

means for initiating reactions comprising a means for injecting hot electrons into the one or more catalysts, the means for injecting hot electrons include a Schottky diode, a p-n junction diode, a conductor insulator metal device, or a conductor semiconductor metal device, or combinations thereof.

* * * * *